(12) United States Patent
Kasa et al.

(10) Patent No.: US 12,449,736 B2
(45) Date of Patent: Oct. 21, 2025

(54) MEASUREMENT APPARATUS AND MEASUREMENT METHOD

(71) Applicant: Kioxia Corporation, Tokyo (JP)

(72) Inventors: Kentaro Kasa, Kariya Aichi (JP);
Soichi Inoue, Yokkaichi Mie (JP);
Satoshi Tanaka, Yokohama Kanagawa (JP); Hiroyuki Tanizaki, Nagoya Aichi (JP)

(73) Assignee: Kioxia Corporation, Tokyo (JP)

( * ) Notice: Subject to any disclaimer, the term of this patent is extended or adjusted under 35 U.S.C. 154(b) by 604 days.

(21) Appl. No.: 17/941,232

(22) Filed: Sep. 9, 2022

(65) Prior Publication Data

US 2023/0251582 A1     Aug. 10, 2023

(30) Foreign Application Priority Data

Feb. 9, 2022  (JP) .................. 2022-018591

(51) Int. Cl.
*G03F 7/00*     (2006.01)
*G01B 11/14*    (2006.01)

(52) U.S. Cl.
CPC .......... *G03F 7/70616* (2013.01); *G01B 11/14* (2013.01); *G03F 7/70625* (2013.01); *G03F 7/70633* (2013.01)

(58) Field of Classification Search
CPC ............. G03F 7/70616; G03F 7/70625; G03F 7/70633; G03F 7/70641; G03F 7/7065; G03F 7/70653; G03F 7/706849; G03F 7/706851; G03F 7/706843; G01B 11/02; G01B 11/26; G01B 11/27; G01B 11/14; G01B 11/272; G01B 2210/56;
(Continued)

(56) References Cited

U.S. PATENT DOCUMENTS 6,974,963 B2     12/2005  Tanaka et al.
8,035,824 B2 *   10/2011  Ausschnitt .......... G03F 7/70633
                                              430/30
(Continued)

FOREIGN PATENT DOCUMENTS

JP         4079885 B2      4/2008
JP      2015-062207 A      4/2015
(Continued)

*Primary Examiner* — Gordon J Stock, Jr.
(74) *Attorney, Agent, or Firm* — Foley & Lardner LLP

(57) ABSTRACT

A measurement apparatus which measures a relative positional displacement amount of a partial pattern to another pattern in a complex pattern on a surface of an object, includes: a measurement part to measure two-dimensional intensity distributions having a first and a second two-dimensional intensity distribution, the first distribution being formed by applying first light having a first shape to a region on which the complex pattern is measured and detecting only zero order diffraction light from the region via a first filter, and the second distribution being formed by applying second light having a second shape to the region and detecting only zero order diffraction light from the region via a second filter; a storage part to store measurement data indicating the distributions; and a calculation part to form a synthesized intensity distribution obtained by the two-dimensional intensity distributions to calculate a positional displacement amount of the partial pattern.

20 Claims, 23 Drawing Sheets

(58) Field of Classification Search
CPC ........... G01N 21/956; G01N 21/95607; G01N 21/95623; G01N 21/95684; G01N 21/95692; G01N 2021/95615
See application file for complete search history.

(56) References Cited

U.S. PATENT DOCUMENTS

| | | | | |
|---|---|---|---|---|
| 8,724,109 | B2* | 5/2014 | Setija | G03F 7/70633 356/399 |
| 9,128,065 | B2* | 9/2015 | Cramer | G01N 21/4788 |
| 10,126,237 | B2* | 11/2018 | Van Der Zouw | G01N 21/956 |
| 10,209,183 | B2* | 2/2019 | Grunzweig | G01N 21/4788 |
| 10,365,230 | B1* | 7/2019 | Amit | G03F 7/70633 |
| 10,401,228 | B2* | 9/2019 | Hill | G01B 11/272 |
| 10,670,975 | B2* | 6/2020 | Socha | G01B 11/272 |
| 10,747,124 | B2* | 8/2020 | Pandey | G03F 7/70633 |
| 10,809,193 | B2* | 10/2020 | Van Dam | G03F 7/70158 |
| 10,895,812 | B2* | 1/2021 | Pandey | G03F 7/70625 |
| 11,009,343 | B2 | 5/2021 | Tinnemans et al. | |
| 2003/0212525 | A1 | 11/2003 | Bischoff et al. | |
| 2006/0007436 | A1* | 1/2006 | Kurosawa | G01N 21/9501 356/237.4 |
| 2012/0123581 | A1* | 5/2012 | Smilde | G03F 7/70483 706/12 |
| 2012/0206729 | A1* | 8/2012 | Seligson | G01N 21/47 356/445 |
| 2012/0250011 | A1* | 10/2012 | Itoh | G03F 1/86 356/237.5 |
| 2016/0377990 | A1 | 12/2016 | Quintanilha | |
| 2017/0059999 | A1 | 3/2017 | Van Der Schaar et al. | |
| 2017/0082932 | A1 | 3/2017 | Fu et al. | |
| 2018/0088469 | A1* | 3/2018 | Otani | G03F 7/7065 |
| 2022/0357674 | A1* | 11/2022 | Hill | G01B 11/26 |
| 2023/0064193 | A1* | 3/2023 | Tinnemans | G03F 7/7065 |

FOREIGN PATENT DOCUMENTS

| | | |
|---|---|---|
| JP | 2018-526674 A | 9/2018 |
| JP | 2021-515416 A | 6/2021 |

* cited by examiner

MEASUREMENT APPARATUS AND MEASUREMENT METHOD

CROSS-REFERENCE TO RELATED APPLICATION

This application is based upon and claims the benefit of priority from Japanese Patent Application No. 2022-018591, filed on Feb. 9, 2022; the entire contents of which are incorporated herein by reference.

FIELD

Embodiments relate to a measurement apparatus and a measurement method.

BACKGROUND

In order to further increase a capacity of a memory, a semiconductor device such as a memory having a three-dimensional structure has been developed.

DETAILED DESCRIPTION

Figure 1:
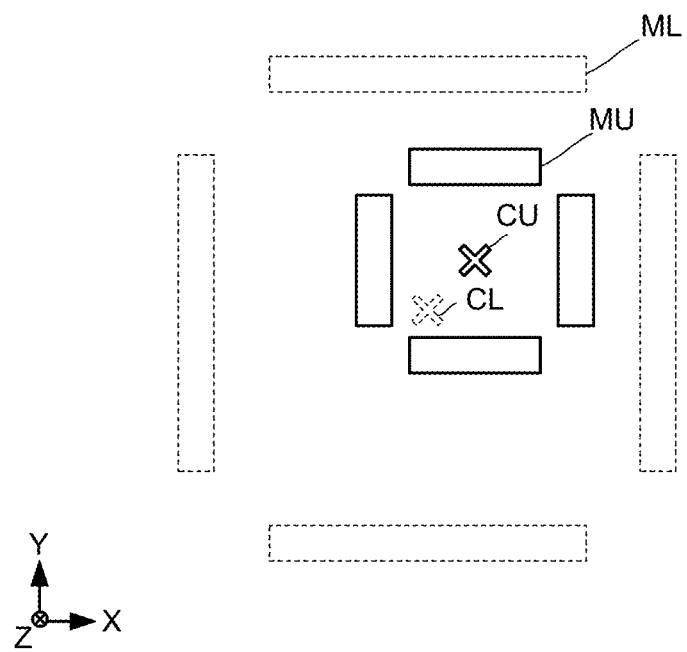
FIG. 1 is a schematic plan view for explaining an example of a common measurement method of a pattern positional displacement amount.

A measurement apparatus of an embodiment is configured to measure a relative positional displacement amount of a partial pattern to another pattern in a complex pattern on a surface of an object.

The apparatus includes:

a measurement part configured to measure a plurality of two-dimensional intensity distributions having a first two-dimensional intensity distribution and a second two-dimensional intensity distribution, the first two-dimensional intensity distribution being formed by applying a first illumination light having a first illumination shape to a region on which the complex pattern is measured and detecting only zero order diffraction light from the region via a first filter, and the second two-dimensional intensity distribution being formed by applying second illumination light having a second illumination shape to the region and detecting only zero order diffraction light from the region via a second filter;

a storage part configured to store a plurality of measurement data indicating the plurality of two-dimensional intensity distributions; and a calculation part configured to execute calculating processing using the plurality of measurement data to form a synthesized intensity distribution obtained by the plurality of two-dimensional intensity distributions, and calculate a positional displacement amount of the partial pattern based on the synthesized intensity distribution.

Embodiments will be hereinafter described with reference to the drawings. In the drawings, the relation of thickness and planer dimension of each constituent element, a thickness ratio among the constituent elements, and so on may be different from actual ones. Further, in the embodiments, substantially the same constituent elements are denoted by the same reference signs, and a description thereof will be appropriately omitted.

First Embodiment

A semiconductor device such as a memory having a three-dimensional structure can be manufactured by processing a structure having a plurality of layers to form at least one pattern such as a circuit pattern or a device pattern. This or these patterns can be formed using, for example, a photolithography technique. When a lower layer pattern is formed in a first process and then an upper layer pattern is formed in a subsequent process in accordance with a position of the lower layer pattern, and an overlay accuracy between the lower layer pattern and the upper layer pattern is low, a manufactured semiconductor device sometimes does not operate normally. Accordingly, a known method of manufacturing a semiconductor device includes measuring a positional displacement amount of a formed pattern to adjust a position of the pattern.

FIG. 1 is a schematic plan view for explaining an example of a common measurement method of a pattern positional displacement amount. FIG. 1 illustrates alignment marks ML of a lower layer pattern, and alignment marks MU of an upper layer pattern. The example of the common measurement method of the pattern positional displacement amount, includes forming the alignment marks ML of the lower layer pattern and the alignment marks MU of the upper layer pattern, and then optically measuring a center distance between a center CL of the alignment marks ML and a center CU of the alignment marks MU to calculate the pattern positional displacement amount.

Figure 2:
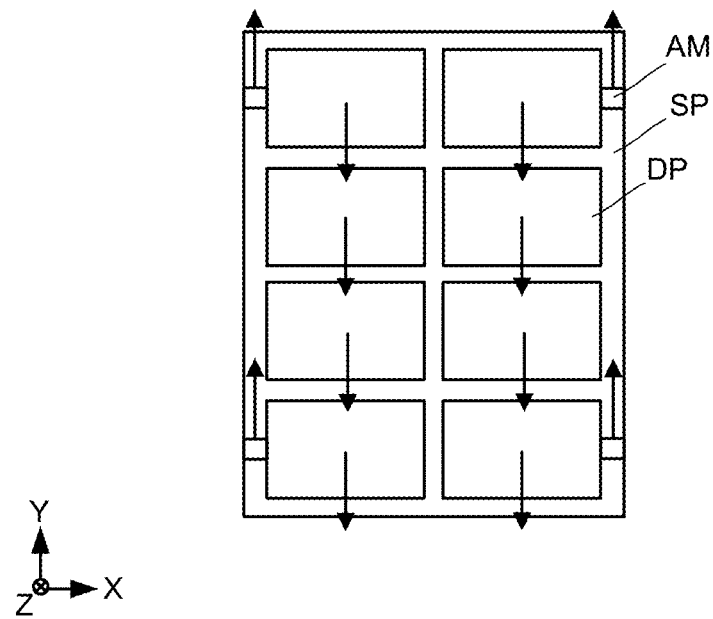
FIG. 2 is a schematic plan view illustrating an example of pattern layout, and illustrates a case in which a direction of positional displacement of an alignment mark AM is different from a direction of positional displacement of a device pattern DP.

Such alignment marks are difficult to be formed in a region same as that of a circuit pattern and a device pattern. FIG. 2 is a schematic plan view illustrating an example of pattern layout. FIG. 2 illustrates alignment marks AM, device patterns DP, and a scribe pattern SP. As illustrated in FIG. 2, when the alignment mark AM is formed in a region different from that of the device pattern DP, a direction of positional displacement of the alignment mark AM is sometimes different from a direction of positional displacement of the device pattern DP, as indicated by arrow marks in FIG. 2. Accordingly, if a positional displacement amount of the device pattern DP is calculated by using the alignment mark AM, a positional displacement amount having a value different from that of the actual displacement amount of the device pattern DP is calculated. Therefore, examples of demanded measurement apparatus can measure a positional displacement amount of a desired pattern with a high calculation accuracy.

Figure 3:
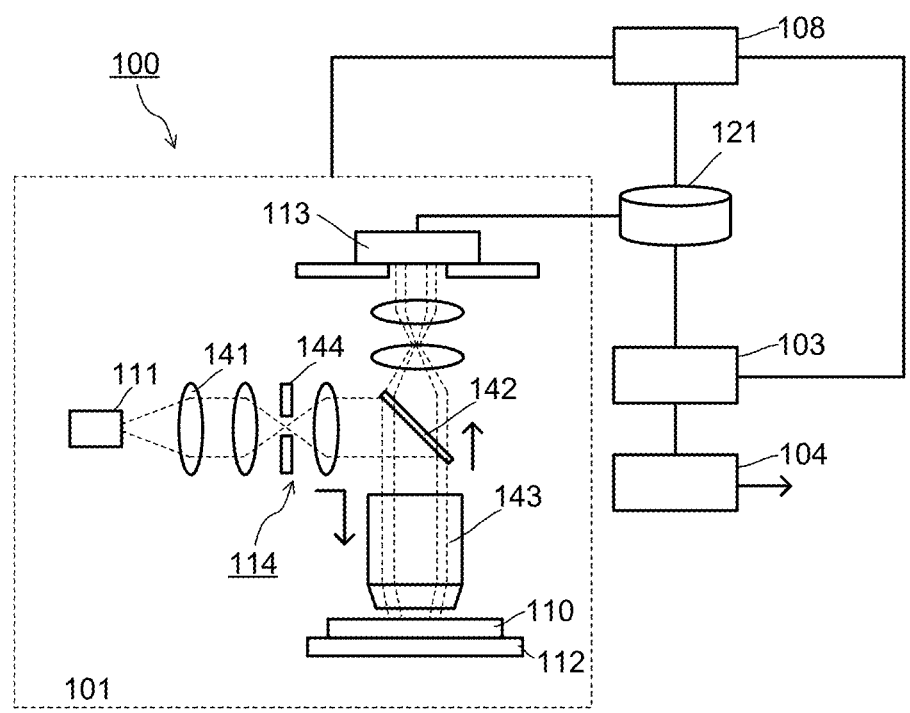
FIG. 3 is a schematic view illustrating a configuration example of a measurement apparatus 100.

Next, a measurement apparatus of an embodiment will be described. FIG. 3 is a schematic view illustrating a configuration example of a measurement apparatus 100. The apparatus 100 has a function of measuring a positional displacement amount of a partial pattern in a complex pattern formed on a surface of an object 110. The apparatus 100 includes a measurement part having a measurement device 101, a storage part having a storage device 121, a calculation part having a calculation device 103, an output part having an output device 104, and a control part having a control device 108. The measurement part, the storage part, the calculation part, the output part, and the control part may be provided in one apparatus, or they may also be provided in a plurality of different apparatuses to configure a measuring system.

The measurement device 101 can measure an intensity distribution of diffraction light generated by applying light to the object 110. The measurement device 101 has a light source 111, a stage 112, an imaging device 113, and an optical system 114.

The light source 111 can emit light. The light source 111 includes, for example, a plurality of point light sources. Examples of the light source 111 include a xenon lamp. The light from the light source 111 has a wavelength of 800 nm, for example, but not limited to this, and it is also possible to switch a wavelength of light according to a control signal of the control device 108, for example.

The stage 112 has a surface for placing the object 110 thereon. The stage 112 can operate in an X-axis direction, a Y-axis direction, and a Z-axis direction, and by scanning the stage 112 on an X-Y plane, it is possible to move the object 110 to perform measurement.

The imaging device 113 can measure a two-dimensional intensity distribution of zero order diffraction light generated by applying light to the object 110. The imaging device 113 can measure a two-dimensional intensity distribution by receiving only the zero order diffraction light out of diffraction lights generated by applying illumination light to a region to be measured of the complex pattern, for example. A use of a two-dimensional detector consisting of photosensitive pixel array arranged on the X-Y plane, as the imaging device 113, can measure the two-dimensional intensity distribution. Examples of the two-dimensional detector include image sensors such as a Charge Coupled Device (CCD) sensor and a CMOS sensor.

The optical system 114 has a function of leading the light from the light source 111 to the object 110, and a function of leading the zero order diffraction light generated by applying light to the object 110, to the imaging device 113. The optical system 114 illustrated in FIG. 3 has a plurality of condensing lenses 141, a beam splitter 142, and an objective lens 143 (objective optical system), but the configuration of the optical system 114 is not limited to the configuration illustrated in FIG. 3.

Figure 4:
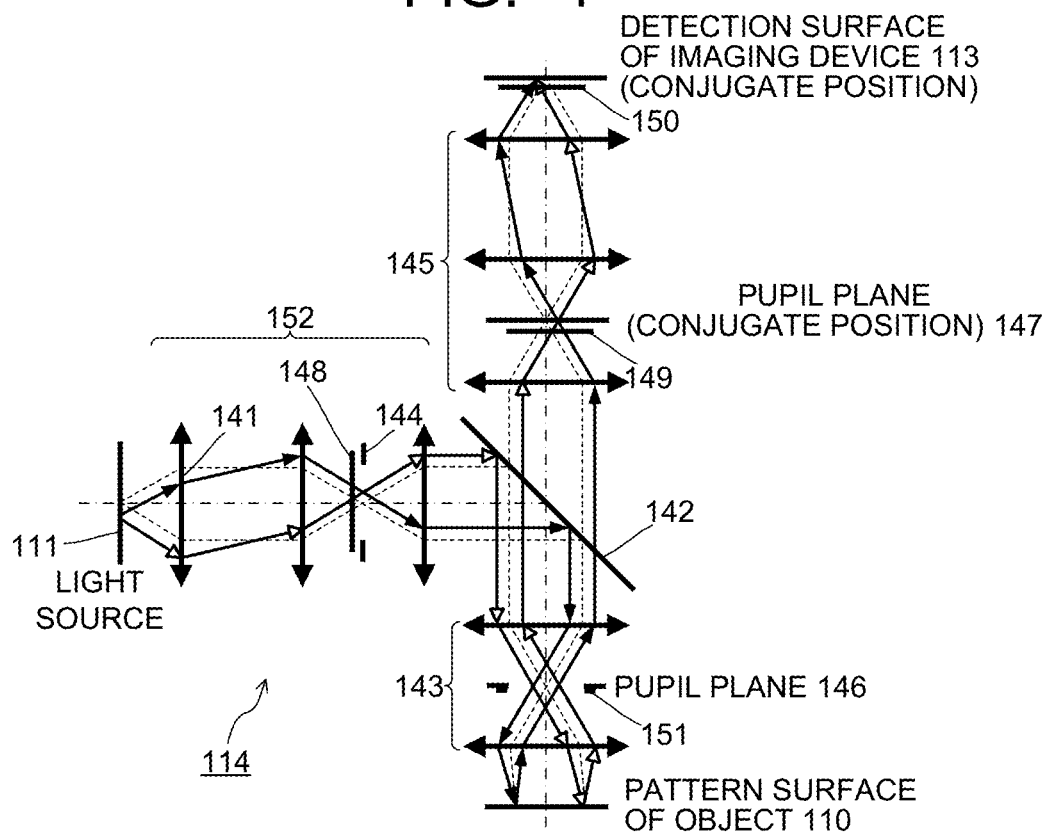
FIG. 4 is a view for explaining a concrete example of an optical system 114, and illustrates an optical path when a position of a point light source is close to an optical axis.
Figure 5:
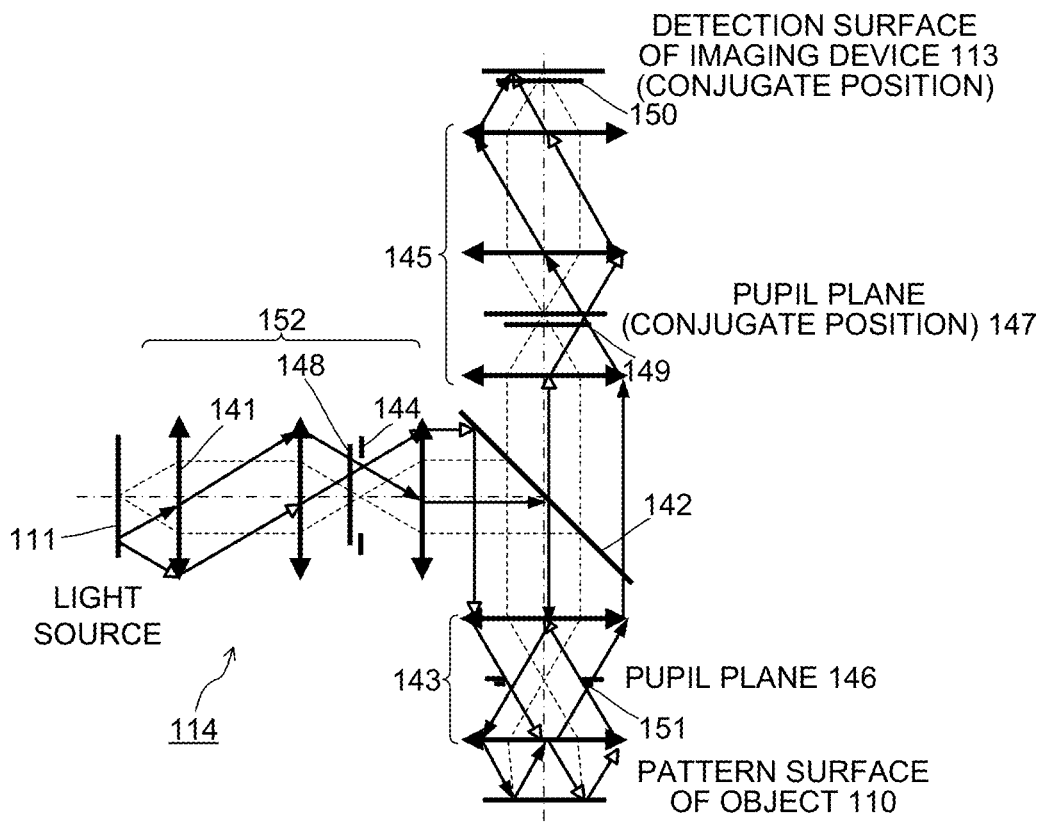
FIG. 5 is a view for explaining a concrete example of the optical system 114, and illustrates an optical path when the position of the point light source is far from the optical axis.

The optical system 114 further has an optical adjuster (illumination shape adjuster) 144. The optical adjuster 144 is arranged at an optically conjugate position with respect to the light source 111, and the optical adjuster 144 can control an external shape of a point light distribution of a light source plane of the light source 111 having an aggregation of point light sources and an intensity distribution of the aggregated point light sources, to adjust an angle distribution of light applied to the surface of the object 110, and form illumination light with a predetermined external shape. Examples of more concrete configurations of the optical system will be illustrated in FIG. 4 and FIG. 5. A light emitted from the light source 111 is imaged by a condensing lenses 141 being a part of the optical system 114, to form a secondary light source. At this position, the optical adjuster 144 is arranged. Further, the object 110 is illuminated by the objective lens 143 via the beam splitter 142. The whole optical system from condensing lenses 141 to a position right in front of the beam splitter 142, will be referred to as an illumination optical system 152. The combination of illumination the optical system 152 and the objective lens 143 has a function of illuminating the surface of the object 110, by the light emitted by the plurality of point light sources in the illumination shape formed using the optical adjuster 144, at a plurality of incident angles corresponding to in-plane positions of the point light sources. The light after being reflected and diffracted by the object 110 is led to an imaging optical system 145 by passing through the objective lens 143 and the beam splitter 142 again, and is led to the imaging device 113 having a detection surface. All of a light source plane of the light source 111, a light source plane of the secondary light source at which the optical adjuster 144 is disposed, a pupil plane 146 of the objective lens 143, a pupil plane 147 of the imaging optical system 145, and the detection surface of the imaging device 113 are optically conjugate planes which are arranged at optically conjugate positions. The objective lens 143 has a function of focusing a plurality of diffraction lights onto a plurality of corresponding positions on the pupil plane 146 in a point shape, the plurality of diffraction lights being diffracted from the surface of the object 110 illuminated at a plurality of incident angles by the illumination optical system 152 at angles respectively corresponding to the plurality of incident angles. As illustrated on a pattern surface side of the object 110 in each of FIG. 4 and FIG. 5, a displacement amount from an optical axis of the point light source corresponds to an illumination angle with respect to the object 110. Specifically, as illustrated in FIG. 4, when the displacement amount from the optical axis of the point light source is small, the illumination angle with respect to the object 110 is small. Further, as illustrated in FIG. 5, when the displacement amount from the optical axis of the point light source is large, the illumination angle with respect to the object 110 becomes large. Specifically, the illumination shape corresponds to an illumination angle distribution with respect to the object 110. Further, in accordance with the illumination angle, an angle of the zero order diffraction light (namely, specular reflection light) is decided non-ambiguously according to the illumination angle. On the pupil plane 146 of the objective lens 143, an NA adjuster 151 is arranged, and a maximum angle of the zero order diffraction light is limited. Specifically, the light diffracted at an angle larger than the angle limited by the NA adjuster is blocked, and cannot proceed further. The angle of the zero order diffraction light is converted into an axial displacement amount of a point image at the detection surface of the imaging device 113. Therefore, at the detection surface, the zero order diffraction lights generated when the object 110 is illuminated as a whole at an angle distribution according to the illumination shape, are collectively acquired as the two-dimensional intensity distribution. Actually, a polarizer 148 is arranged at a predetermined position from, for example, the point light sources to the surface of the object 110 via the illumination optical system 152 in an optical path from the light source 111 to the beam splitter 142, an analyzer 149 is arranged at a predetermined position from, for example, the surface of the object 110 to the imaging device 113 via the objective lens 143 and the beam splitter 132 in an optical path from the surface of the object 110 to the imaging device 113, and planes of polarization of the polarizer 148 and the analyzer 149 are relatively displaced from each other to obtain favorable measurement sensitivity. Normally, the polarizer 148 is often arranged so that its plane of polarization is along a direction in parallel to or perpendicular to a main direction of pattern (a longitudinal direction of a wiring LI or a slit SHE to be described later, in the present embodiment), and the analyzer 149 is arranged perpendicular to the polarizer 148, but not limited to this.

The storage device 121 can store data (measurement data) indicating the two-dimensional intensity distribution of the diffraction light measured by the measurement device 101. The storage device 121 can further store a measuring program for executing a measuring operation using the measurement device 101, an calculating program for executing calculating processing using the calculation device 103, and a control program for controlling respective operations of the measurement device 101, the storage device 121, and the calculation device 103 using the control device 108. Examples of the storage device 121 include a hard disk drive and a solid state drive. The storage device 121 may also be provided in the measurement device 101.

The storage device 121 may also store data indicating measurement conditions (measurement condition data) used by the measurement device 101. The measurement condition data is read using the control device 108. The measurement condition data includes information indicating a spot shape of light, a wavelength of light, and a pixel filter. The storage device 121 stores a plurality of different pieces of measurement condition data, and read these pieces of measurement condition data if necessary, to perform measurement under a plurality of measurement conditions.

The pixel filter has a function of leading, for example, only the zero order diffraction light to the imaging device 113. The pixel filter is not limited to a filtering software, and it may also be a physical light shield. A filter 150 defined by a physical light shield is provided between, for example, the stage 112 and the imaging device 113. More concretely, the physical light shield is preferably provided at a conjugate position with respect to the pupil plane 146 of the objective lens 143. Namely, the physical light shield may also be provided in the vicinity of the pupil plane 147 of the imaging optical system 145 or in the vicinity of the detection surface of the imaging device 113. Each of FIG. 4 and FIG. 5 exemplifies a case where the filter 150 is provided in the vicinity of the detection surface of the imaging device 113.

The calculation device 103 can perform the calculating processing using a plurality of measurement data, and calculate a partial pattern positional displacement amount based on a result of the calculating processing. Examples of the calculation device 103 include a computer such as a personal computer. The calculation device 103 may also be provided in the measurement device 101.

The calculation device 103 may also have a pixel synthesizing mechanism which synthesizes a plurality of two-dimensional intensity distributions through the calculating processing to form a two-dimensional intensity distribution (synthesized intensity distribution). When the storage device 121 includes information indicating the pixel filter, the calculation device 103 may also have a mechanism of extracting pixel data (pixel extracting mechanism) by reading the measurement condition data having the pixel filter from the storage device 121 and executing filter processing.

The output device 104 can output data indicating the partial pattern positional displacement amount calculated based on the result of the calculating processing, to the outside. Examples of the output device 104 include a computer which reads a file storage program and performs processing in a central processing unit (CPU). The output device 104 may also be provided in the measurement device 101.

The control device 108 controls the respective operations of the measurement device 101, the storage device 121, and the calculation device 103. Examples of the control device 108 include a computer such as a personal computer. The control device 108 may also be provided in the measurement device 101.

Figure 6:
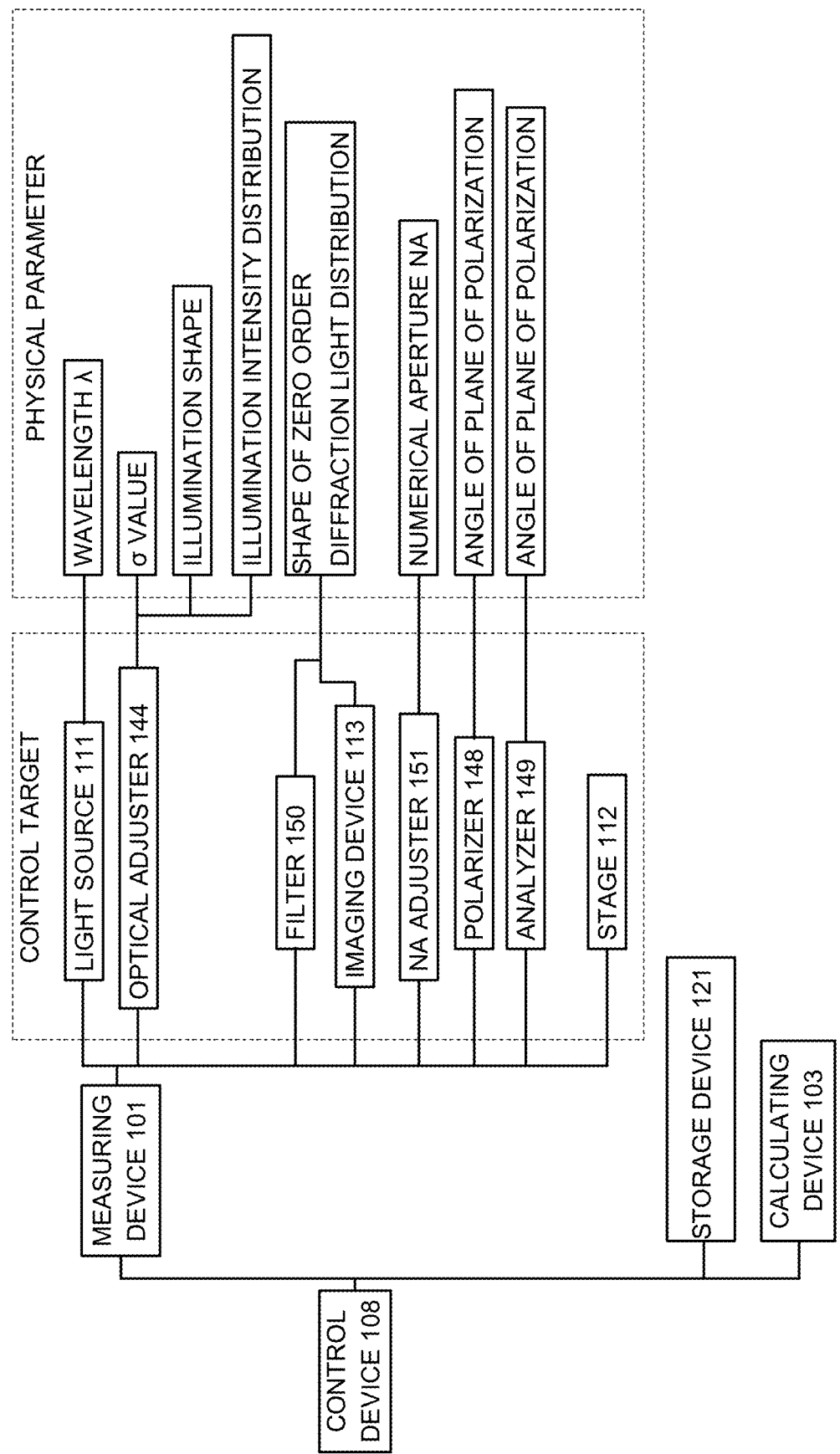
FIG. 6 is a view for explaining examples of control targets which are controlled by a control device 108, and examples of physical parameters to be controlled.

FIG. 6 is a view for explaining examples of control targets which are controlled using the control device 108, and examples of physical parameters to be controlled. When the control device 108 controls the light source 111, the control device 108 may also have a light wavelength control mechanism for controlling the light source 111 to control the wavelength of light from the light source 111. When the control device 108 controls the optical adjuster 144, the control device 108 may also control the optical adjuster 144 to adjust a σ value and an illumination shape provided by the light source 111 defined by an aggregation of point light sources, and an intensity distribution of a plurality of light-emitting points in the illumination shape formed by the optical adjuster 144. The control device 108 may also control the NA adjuster 151 to adjust the numerical aperture NA of the objective lens 143. The control device 108 may also adjust each of angles of the planes of polarization of the polarizer 148 and the analyzer 149. Each of the light wavelength control mechanism and an illumination shape control mechanism may also be provided separately from the control device 108.

When the apparatus 100 has the pixel filter formed of the physical light shield, the control device 108 may also have a filter shape control mechanism of controlling the light shield according to the measurement condition data to adjust a filter shape. When the apparatus 100 does not have the pixel filter formed of the physical light shield, the control device 108 may also control the imaging device 113 according to the measurement condition data (illumination shape), to limit a signal reading region.

Next, an example of the object 110 will be described. An example of the object 110 is a intermediate structure which is formed in the middle of manufacturing a semiconductor storage device.

Figure 7:
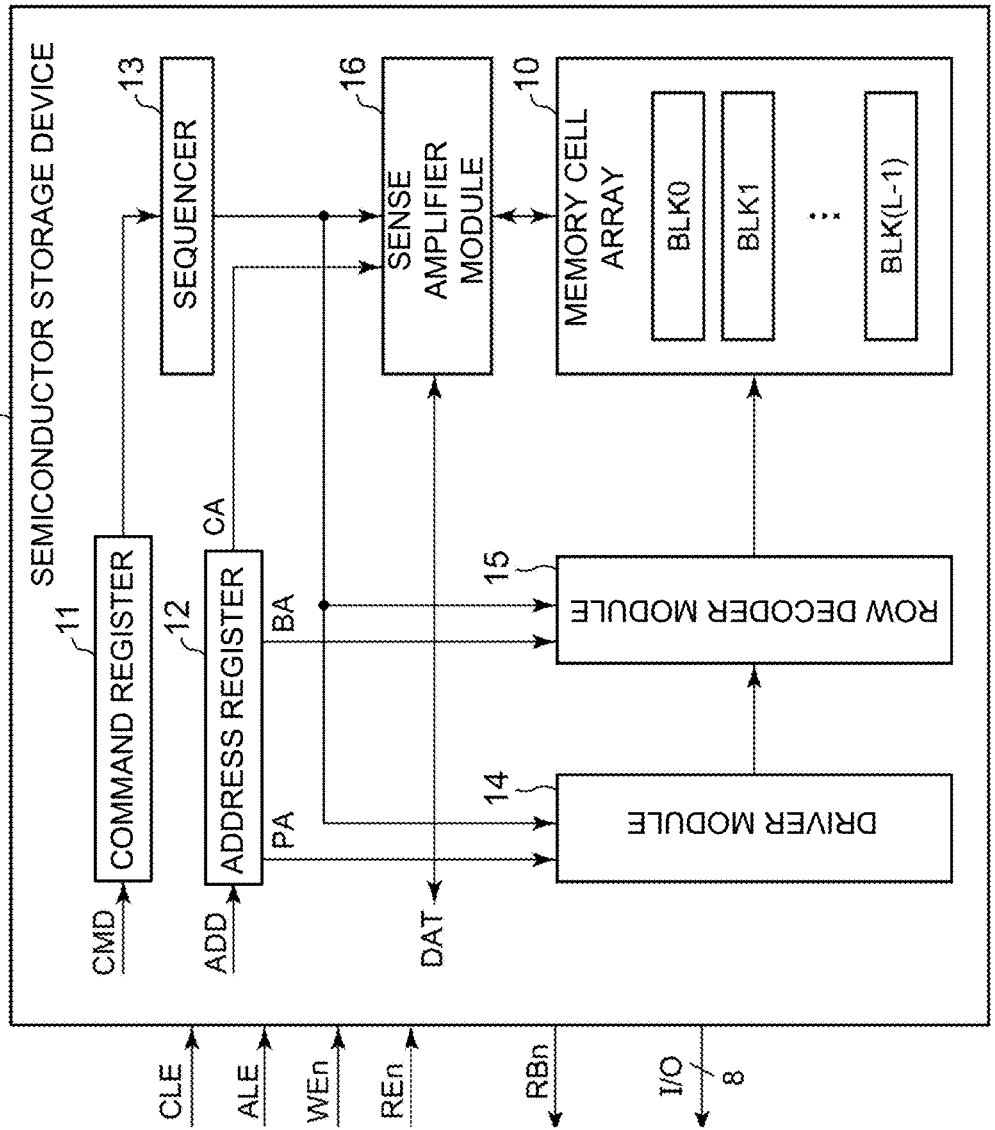
FIG. 7 is a block diagram illustrating an entire configuration of a semiconductor storage device.

First, an example of a semiconductor storage device will be described. FIG. 7 is a block diagram illustrating an entire configuration of the semiconductor storage device. A semiconductor storage device 1 is controlled by a memory controller, for example. The semiconductor storage device 1 includes a memory cell array 10, a command register 11, an address register 12, a sequencer 13, a driver module 14, a row decoder module 15, and a sense amplifier module 16.

The memory cell array 10 includes a plurality of blocks BLK0 to BLK(L-1) (L is an integer of 2 or more). Each of the blocks BLK is a set of a plurality of memory cell transistors (which will be described as "memory cells" in some cases hereinafter) which store data in a nonvolatile manner, and used as an erase unit of data, for example. The memory cell array 10 is provided with a plurality of bit lines and a plurality of word lines. The memory cell transistors are each related to one bit line and one word line, for example. A detailed configuration of the memory cell array 10 will be described later.

The command register 11 can hold a command CMD received by the semiconductor storage device 1 from the memory controller. The command CMD includes, for example, a command causing the sequencer 13 to execute a read operation, a write operation, an erase operation, and the like. The address register 12 can hold address information ADD received by the semiconductor storage device 1 from the memory controller. The address information ADD includes, for example, a block address BA, a page address PA, and a column address CA. For example, the block address BA, the page address PA, and the column address CA are used for selecting a block BLK, a word line, and a bit line, respectively.

The sequencer 13 controls the entire operation of the semiconductor storage device 1. For example, the sequencer 13 controls the driver module 14, the row decoder module 15, the sense amplifier module 16, and so on based on the command CMD held in the command register 11 to execute the read operation, the write operation, the erase operation, and so on.

The driver module 14 generates a voltage used for the read operation, the write operation, the erase operation, and so on. Further, the driver module 14 applies the generated voltage to a signal line corresponding to the word line selected based on the page address PA held in the address register 12, for example.

Based on the block address BA held in the address register 12, the row decoder module 15 selects a corresponding one of the blocks BLK in the memory cell array 10. Subsequently, for example, the row decoder module 15 transfers the voltage applied to the signal line corresponding to the selected word line, to the selected word line in the selected block BLK.

In the write operation, the sense amplifier module 16 applies a desired voltage to each bit line according to write data DAT received from the memory controller. Further, in the read operation, the sense amplifier module 16 determines data stored in the memory cell based on the voltage of the bit line or a current that flows through the bit line, and transfers the determination result as read data DAT to the memory controller.

The communication between the semiconductor storage device 1 and the memory controller supports the NAND interface, for instance. For example, in the communication between the semiconductor storage device 1 and the memory controller, a command latch enable signal CLE, an address latch enable signal ALE, a write enable signal WEn, a read enable signal REn, a ready/busy signal RBn, and an input/output signal I/O are used.

The command latch enable signal CLE is a signal indicating that an input/output signal I/O received by the semiconductor storage device 1 is a command CMD. The address latch enable signal ALE is a signal indicating that a signal I/O received by the semiconductor storage device 1 is address information ADD. The write enable signal WEn is a signal used for controlling data input from an input/output signal I/O. The read enable signal REn is a signal used for controlling data output from an input/output signal I/O.

The ready/busy signal RBn is a signal that notifies the memory controller whether the semiconductor storage device 1 is in a ready state in which it accepts a command from the memory controller or is in a busy state in which it does not accept a command.

The input/output signal I/O is a signal with, for example, an eight-bit width, and can include the command CMD, the address information ADD, the data DAT, and so on.

A combination of the semiconductor storage device 1 and the memory controller explained above may form one semiconductor storage device. As such a semiconductor storage device, there can be cited, for example, a memory card such as an SD card, an SSD (Solid State Drive), and so on.

Figure 8:
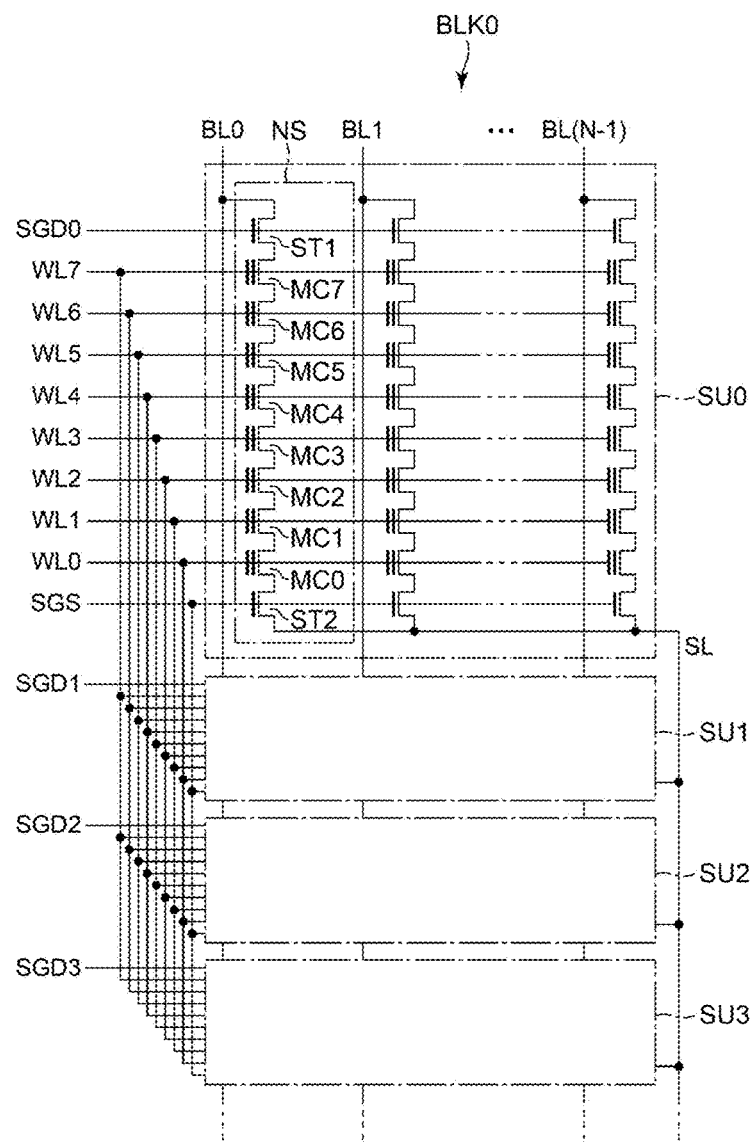
FIG. 8 is a view illustrating a circuit configuration example of a memory cell array 10.

Next, a circuit configuration of the memory cell array 10 will be explained while using FIG. 8. FIG. 8 illustrates the block BLK0 as an example, but the circuit configurations of the other blocks BLK are also the same. As illustrated in FIG. 8, the block BLK0 includes four string units SU0 to SU3, for example. Each string unit SU includes a plurality of NAND strings NS.

The plurality of NAND strings NS are related to bit lines BL0 to BL(N−1) (N is an integer of 2 or more), respectively. The NAND strings NS each include, for example, memory cell transistors MC0 to MC7, and select transistors ST1 and ST2.

The memory cell transistors MC each include a control gate and a charge storage layer, and can hold data in a nonvolatile manner. Hereinafter, the memory cell transistors MC0 to MC7 will be described as memory cell transistors MC, unless any of them is limited. The memory cell transistor MC may be of a MONOS type using an insulation film as a charge storage layer or may be of an FG type using a conductive layer as a charge storage layer. Hereinafter, the MONOS type will be explained as an example in the embodiment.

The select transistor ST1 is used for selecting a string unit SU at the time of the various operations. In each of the NAND strings NS, a drain of the select transistor ST1 is connected to the corresponding bit line BL. A source of the select transistor ST1 is connected to one end of the serially connected memory cell transistors MC0 to MC7. The other end of the serially connected memory cell transistors MC0 to MC7 is connected to a drain of the select transistor ST2.

In the same block BLK, the sources of the select transistors ST2 are connected in common to a source line SL. Gates of the select transistors ST1 in the string units SU0 to SU3 are connected in common to select gate lines SGD0 to SGD3, respectively. Control gates of the memory cell transistors MC0 to MC7 are connected in common to word lines WL0 to WL7, respectively. Gates of the select transistors ST2 are connected in common to select gate lines SGS.

In the circuit configuration of the memory cell array 10 explained above, the plurality of NAND strings NS to which the same column address CA is assigned are connected in common to the same bit line BL in the plurality of blocks BLK. The source line SL is connected in common among the plurality of blocks BLK.

The circuit configuration of the memory cell array 10 included in the semiconductor device is not limited to the configuration explained above. For example, each of the number of the memory cell transistors MC, and the number of the select transistors ST1 and ST2 included in each NAND string NS may be set to a predetermined number. The number of the string units SU included in each block BLK may be set to a predetermined number.

Figure 9:
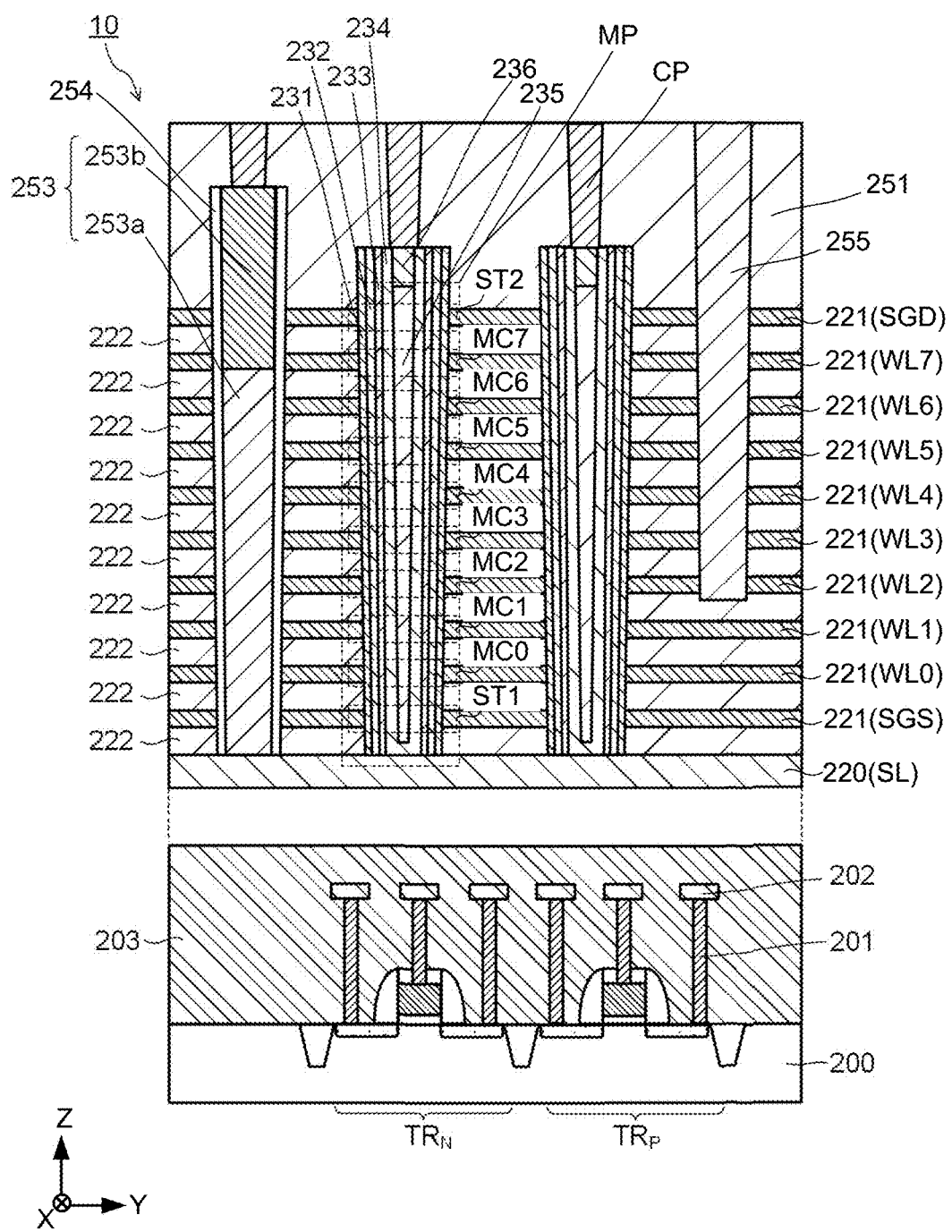
FIG. 9 is a view illustrating an example of a cross-sectional configuration of the semiconductor storage device.

Next, a cross-sectional configuration of the semiconductor storage device will be described by using FIG. 9. FIG. 9 is a view for explaining a structural example of the semiconductor storage device, and illustrates a Y-Z cross section expressed by an X-axis substantially parallel to a surface (upper surface) of a semiconductor substrate 200, a Y-axis substantially perpendicular to the X-axis, and a Z-axis substantially perpendicular to the X-axis and the Y-axis.

As illustrated in FIG. 9, an insulation layer 203 is formed on the semiconductor substrate 200. The insulation layer 203 is can be made from silicon oxide, for example. The memory cell array 10 is provided on the insulation layer 203. Peripheral circuits are formed below the memory cell array 10. In FIG. 9, a circuit region having the peripheral circuits is provided below a memory cell region having the memory cell array 10, but not limited to this, and the circuit region may also be provided so as to be arranged side by side with the memory cell region.

First, a configuration of the memory cell array 10 will be described. On the insulation layer 203, a conductive layer 220 which functions as the source line SL is provided. For example, the conductive layer 220 is formed in a plate shape provided along the X-Y plane substantially parallel to the surface (upper surface) of the semiconductor substrate 200. The conductive layer 220 can be made from a conductive material, and examples of the conductive material include a metal material and a semiconductor material.

The upper side of the conductive layer 220 includes a structure that each of a plurality of conductive layers 221 and each of a plurality of insulation layers 222 are alternately stacked. The insulation layer 222 can be made from SiO, for example. The plurality of conductive layers 221 function as the select gate line SGS, the word lines WL0 to WL7, and the select gate line SGD, in the order from below, for example. For instance, the conductive layer 221 is formed in a plate shape extending in the X-axis direction. The conductive layer 221 can be made from a conductive material, and examples of the conductive material include a metal material.

The memory cell array 10 includes a plurality of memory pillars MP penetrating (passing through) the plurality of conductive layers 221 in the Z-axis direction and having bottom surfaces which reach the conductive layer 220. The memory pillar MP extends in the Z-axis direction. One memory pillar MP corresponds to one NAND string NS. The memory pillar MP includes a block insulation film 231, a charge storage layer 232, a tunnel insulation film 233, a semiconductor layer 234, a core insulator 235, and a cap layer 236.

More concretely, a hole corresponding to the memory pillar MP is formed by penetrating the plurality of conductive layers 221, in a manner that a bottom surface of the hole reaches the conductive layer 220. On an inner side surface of the hole, the block insulation film 231, the charge storage layer 232, and the tunnel insulation film 233 are stacked in order. Subsequently, the semiconductor layer 234 is formed so that its side surface is provided on the tunnel insulation film 233 and its bottom surface is provided on the conductive layer 220. The semiconductor layer 234 is a region in which channels of the memory cell transistors MC and the select transistors ST1 and ST2 are formed. Accordingly, the semiconductor layer 234 functions as a signal line connecting current paths of the select transistor ST2, the memory cell transistors MC0 to MC7, and the select transistor ST1. The core insulator 235 is provided on the inner side of the semiconductor layer 234. Further, on the semiconductor layer 234 and the core insulator 235, the cap layer 236 whose side surface on the tunnel insulation film 233 is formed.

The block insulation film 231, the tunnel insulation film 233, and the core insulator 235, can be made from SiO, for example. The charge storage layer 232 can be made from silicon nitride (SiN), for example. The semiconductor layer 234 and the cap layer 236 can be made from polysilicon, for example.

The memory pillar MP and the plurality of conductive layers 221 which function as the word lines WL0 to WL7, respectively, are combined to function as the memory cell transistors MC0 to MC7. In similar to this, the memory pillar MP and the plurality of conductive layers 221 which function as the select gate line SGD and the select gate line SGS, respectively, are combined to function as the select transistor ST1 and the select transistor ST2.

The upper side of the cap layer 236 includes a contact plug CP. The upper side of the contact plug CP includes a conductive layer (not illustrated) which functions as a bit line BL. The contact plug CP can be made from a conductive material, and examples of the conductive material include a metal material.

FIG. 9 shows that the memory pillar MP are arranged along the Y-axis direction, but they may be arranged in a predetermined manner.

An insulation layer 251 is provided on a stack of the conductive layers 221 and the insulation layers 222. The insulation layer 251 contains silicon oxide formed by using tetraethylorthosilicate (TEOS), for example.

A conductive pattern 253 has a function as a separator which electrically separates the word lines WL0 to WL7, the select gate line SGD, and the select gate line SGS for each group defined by a plurality of NAND strings NS. The group is also called a finger. The conductive pattern 253 also has a function as a wiring (which is also referred to as a local interconnect wiring) LI connected to the source line SL. The conductive pattern 253 penetrates the plurality of conductive layers 221 in the Z-axis direction to reach the conductive layer 220. The conductive pattern 253 has a conductive pattern 253a provided on the conductive layer 220, and a conductive pattern 253b provided on the conductive pattern 253a. The conductive pattern 253a is formed by using a semiconductor material such as polysilicon, for example. The conductive pattern 253b is formed by using a metal material such as tungsten, for example.

An insulation layer 254 is provided between the conductive pattern 253 and each of the plurality of conductive layers 221. The insulation layer 254 can be made from an insulating material such as silicon oxide, for example.

An insulation layer 255 penetrates the conductive layer 221 corresponding to the select gate line SGD in the Z-axis direction and does not penetrate the conductive layer 221 corresponding to the select gate line SGS in the Z-axis direction, out of the plurality of conductive layers 221. The insulation layer 255 has a function as a separator which electrically isolates the select gate line SGD for each group defined by a plurality of NAND strings NS. The insulation layer 255 can be made from an insulating material such as silicon oxide, for example.

The circuit region has a field-effect transistor $TR_N$ and a field-effect transistor $TR_P$. The field-effect transistor $TR_N$ and the field-effect transistor $TR_P$ can be used for the peripheral circuits such as, for example, the command register 11, the address register 12, the sequencer 13, the driver module 14, the row decoder module 15, and the sense amplifier module 16. A channel length direction of the field-effect transistor $TR_N$ and the field-effect transistor $TR_P$ is the Y-axis direction, for example, and a channel width direction of the transistors is the X-axis direction, for example.

The field-effect transistor $TR_N$ and the field-effect transistor $TR_P$ are provided below the memory cell array 10. The field-effect transistor $TR_N$ is an N-channel type transistor. The field-effect transistor $TR_P$ is a P-channel type transistor.

Each of a plurality of conductive layers 201 forms a contact plug. A plurality of conductive layers 202 form one wiring layer, and each of the conductive layers 202 forms each wiring of the aforementioned wiring layer. Each of the conductive layers 202 is connected to any of a gate, a source, and a drain of the field-effect transistor $TR_N$ or the field-effect transistor $TR_P$ via the conductive layer 201, for example. The conductive layer 201 and the conductive layer 202 contain a metal material.

The insulation layer 203 insulates between the field-effect transistor $TR_N$ and the field-effect transistor $TR_P$, between the plurality of conductive layers 201, and between the plurality of conductive layers 202, for example. The insulation layer 203 contains silicon oxide, for example. The field-effect transistor $TR_N$ and the field-effect transistor $TR_P$ are connected to the memory cell array 10 via not only the conductive layers 201 and the conductive layers 202 but also other wiring layers and contact plugs, but illustration of these will be omitted in the present embodiment for convenience.

Figure 10:
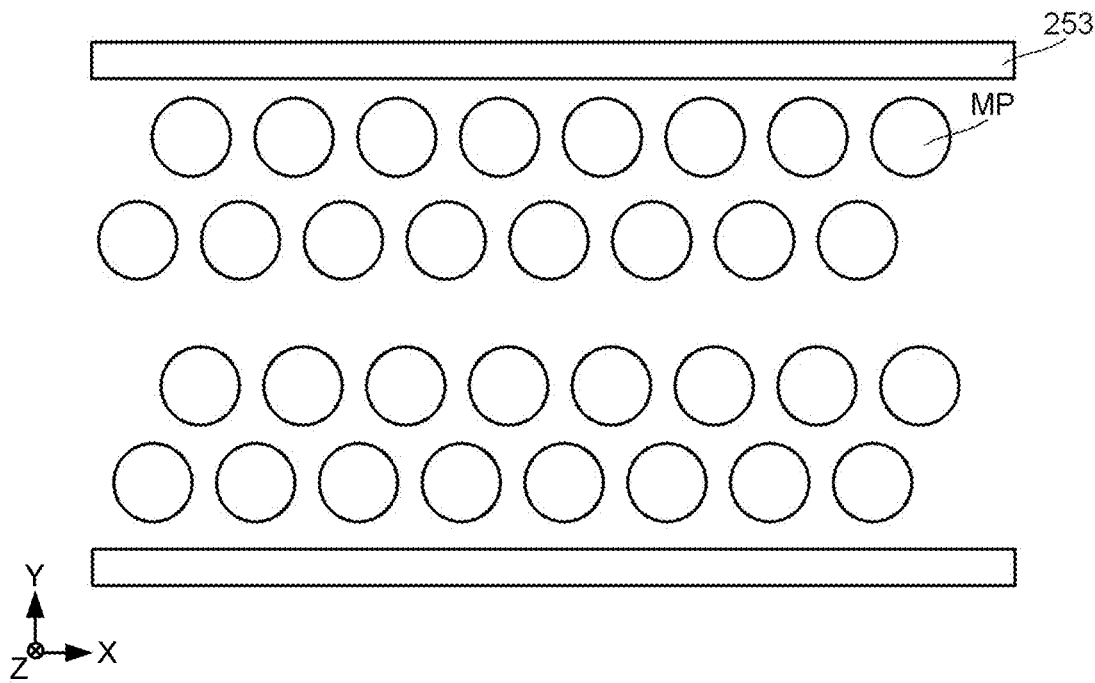
FIG. 10 is a schematic view of an X-Y plane illustrating a state of a structure before forming a slit SHE and an insulation layer 255.
Figure 11:
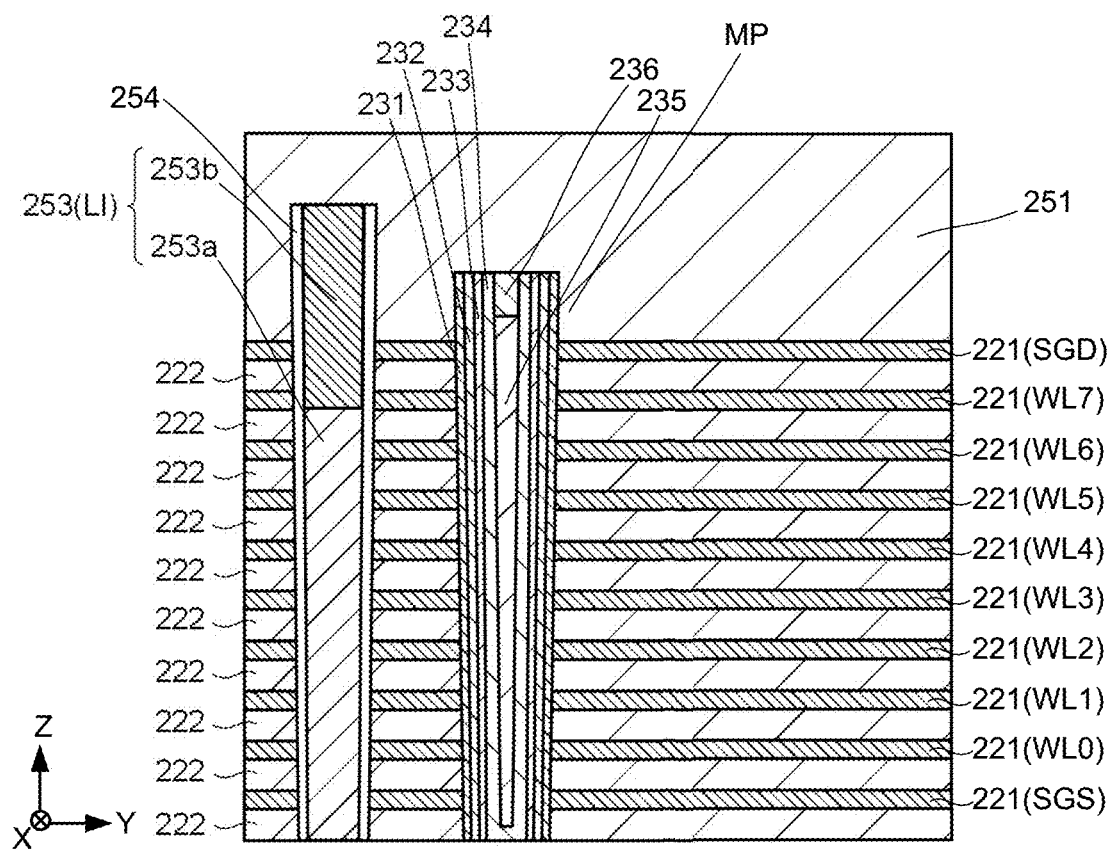
FIG. 11 is a schematic view of a Y-Z cross section illustrating a state of the structure before forming the slit SHE and the insulation layer 255.

Next, an example of formation of the insulation layer 255 will be described as an example of a manufacturing method of the semiconductor storage device. Each of FIG. 10 and FIG. 11 is a schematic view illustrating a state of a structure before forming the insulation layer 255. FIG. 10 is a schematic view of an X-Y plane. FIG. 11 is a schematic view of a Y-Z cross section. As illustrated in FIG. 10 and FIG. 11, the memory pillar MP and the conductive pattern 253 are respectively formed so as to penetrate the plurality of conductive layers 221, before forming the insulation layer 255. The memory pillar MP and the conductive pattern 253 before forming the insulation layer 255 form a first complex pattern. The first complex pattern includes a plurality of types of repetitive patterns.

Figure 12:
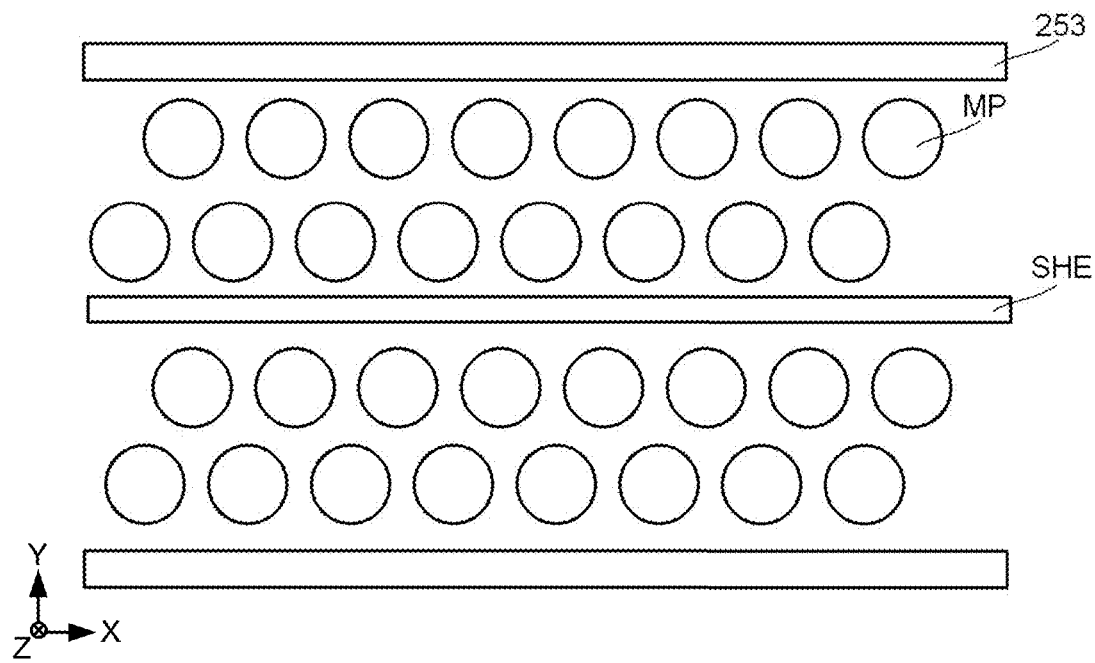
FIG. 12 is a schematic view of an X-Y plane illustrating a state of a structure after forming the slit SHE and before forming the insulation layer 255.
Figure 13:
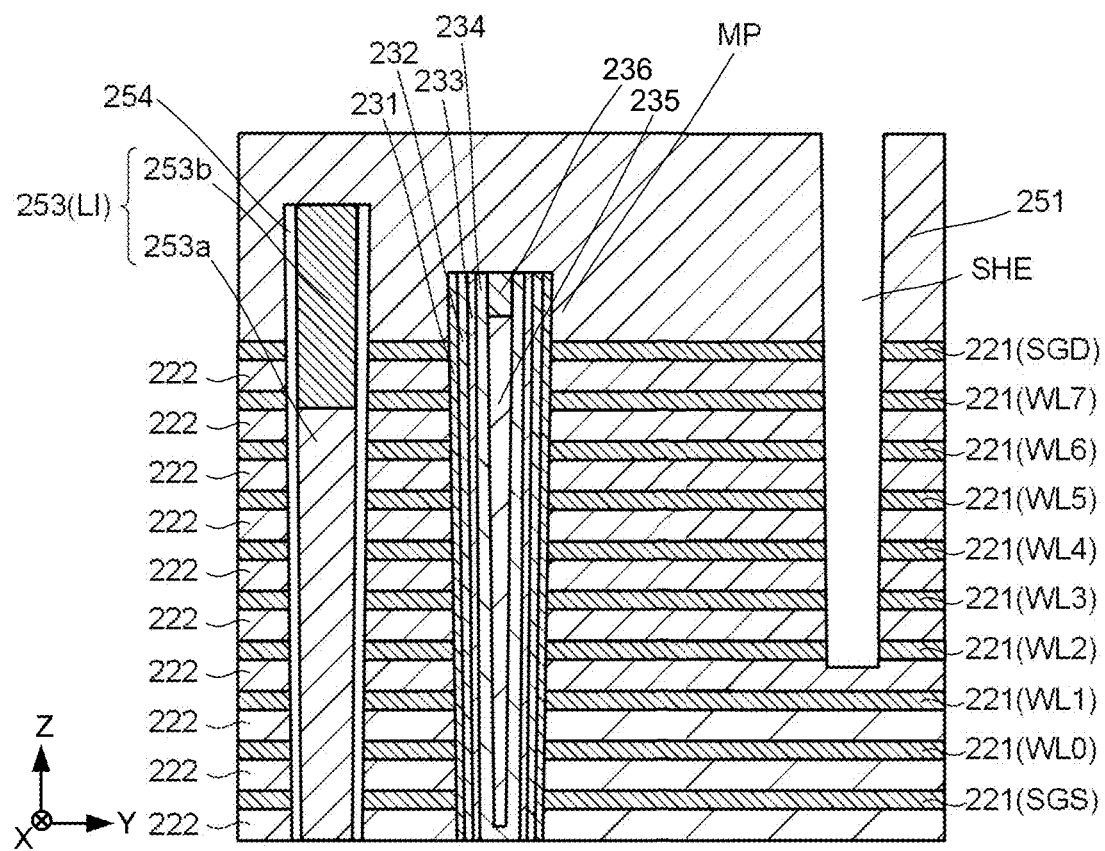
FIG. 13 is a schematic view of a Y-Z cross section illustrating a state of the structure after forming the slit SHE and before forming the insulation layer 255.

Each of FIG. 12 and FIG. 13 is a schematic view for explaining an example of formation of the insulation layer 255. FIG. 12 is a schematic view of an X-Y plane. FIG. 13 is a schematic view of a Y-Z cross section. Portions illustrated in FIG. 12 and FIG. 13 are the same as the portions illustrated in FIG. 10 and FIG. 11. As illustrated in FIG. 12 and FIG. 13, before forming the insulation layer 255, a slit SHE which extends in the Z-axis direction so as to penetrate the conductive layer 221 corresponding to the select gate line SGD and not to reach the conductive layer 221 corresponding to the select gate line SGS, out of the plurality of conductive layers 221, is formed. The slit SHE can be formed by processing the conductive layers 221 and the insulation layers 222 by using etching, for example. The memory pillar MP, the conductive pattern 253, and the slit SHE before forming the insulation layer 255 form a second complex pattern. The memory pillar MP, the conductive pattern 253, and the slit SHE respectively include repetitive patterns. After that, the insulation layer 255 is formed so as to fill the slit SHE. The insulation layer 255 can be formed by using CVD or the like, for example.

When a positional displacement amount of the slit SHE is large and the slit SHE overlaps with the memory pillar MP in a plan view, the semiconductor storage device sometimes causes an operation failure. For this reason, it is preferable to measure how much the position of pattern of the slit SHE is displaced from a designed position, namely, it is preferable to measure a positional displacement amount, based on a position of pattern of the memory pillar MP included in the first complex pattern. Accordingly, a feedback correction of the position of pattern of the slit SHE can be applied in a manufacturing process of the semiconductor storage device.

Figure 14:
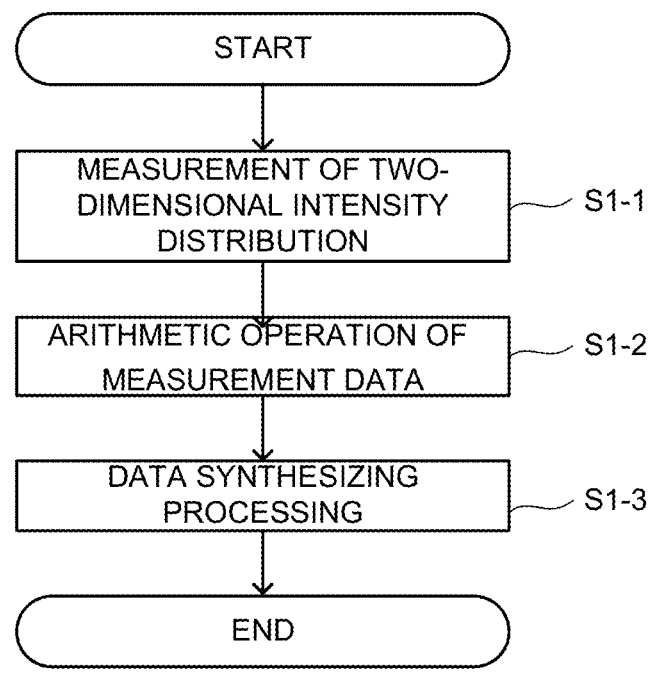
FIG. 14 is a flow chart for explaining an example of a measurement method of a first embodiment.
Figure 15:
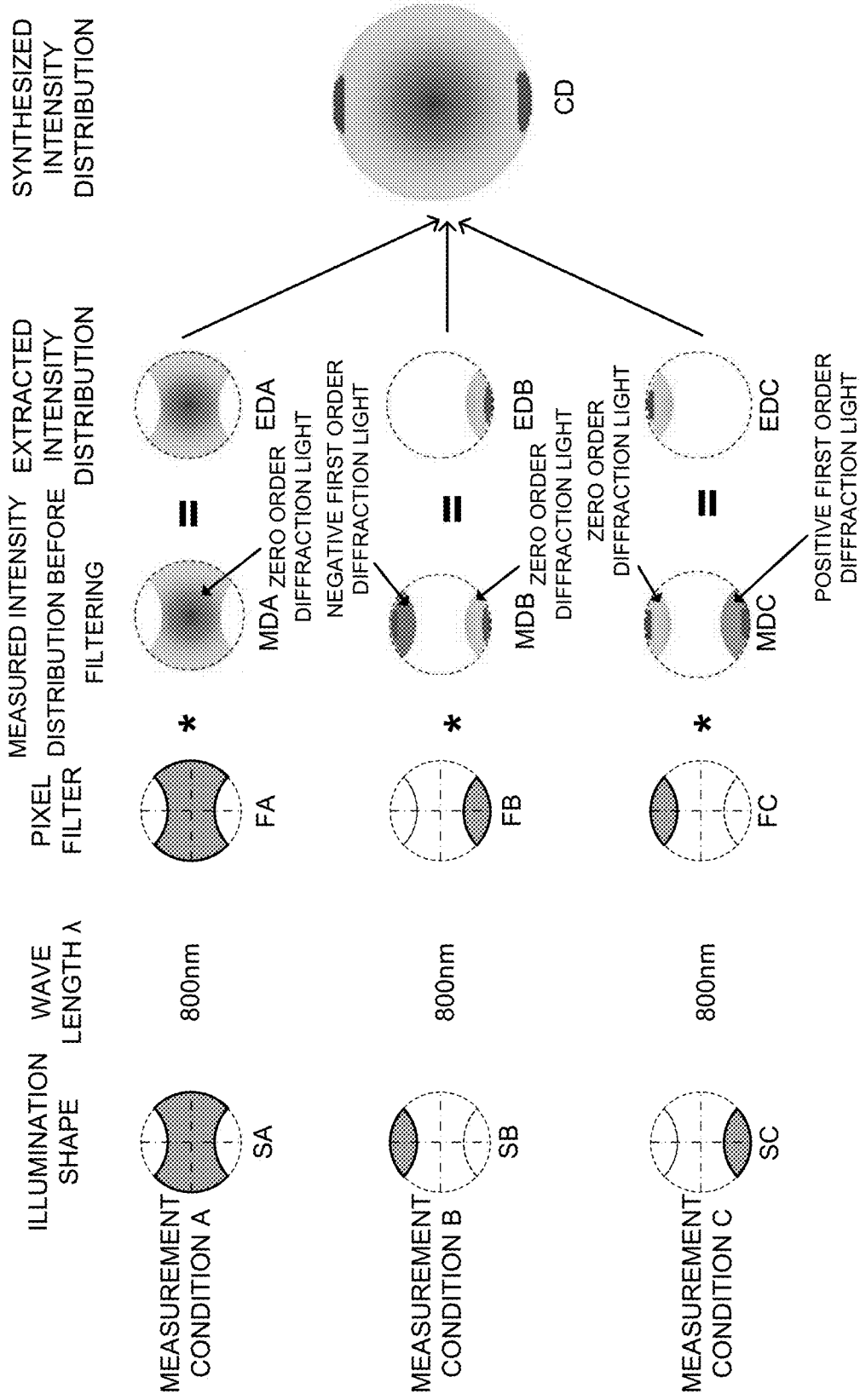
FIG. 15 is a schematic view for explaining an example of the measurement method of the first embodiment.

Next, an example of a method of measuring a positional displacement amount of the pattern (partial pattern) of the slit SHE using the apparatus 100 will be described. FIG. 14 is a flow chart for explaining an example of the measurement method. FIG. 15 is a schematic view for explaining an example of the measurement method, and illustrates an example in which two-dimensional intensity distributions measured by using three pieces of measurement condition data, are synthesized, and a partial pattern positional displacement amount is measured using the synthesized intensity distribution. The measurement method is not limited to the example to be explained by using FIG. 15.

As illustrated in FIG. 14, the example of the measurement method includes a measuring step S1-1, an calculating step S1-2, and a data processing step S1-3. The example of the measurement method can be performed by reading the control program stored in the storage part such as the storage device 121 using the control device 108 to execute a measuring program having respective steps using the measurement device 101, the storage device 121, and the calculation device 103.

Figure 16:
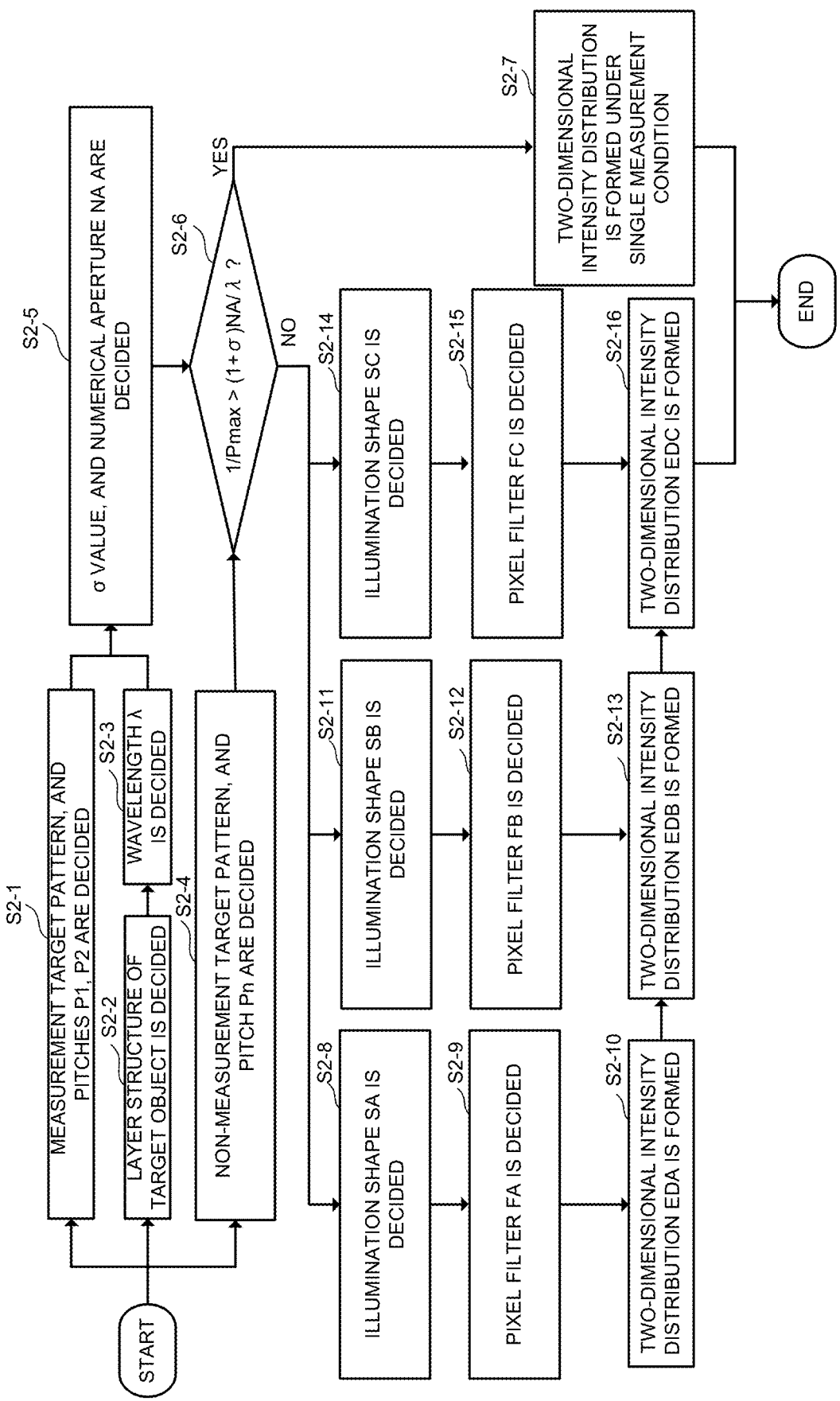
FIG. 16 is a flow chart for explaining a measuring step S1-1.
Figure 21:
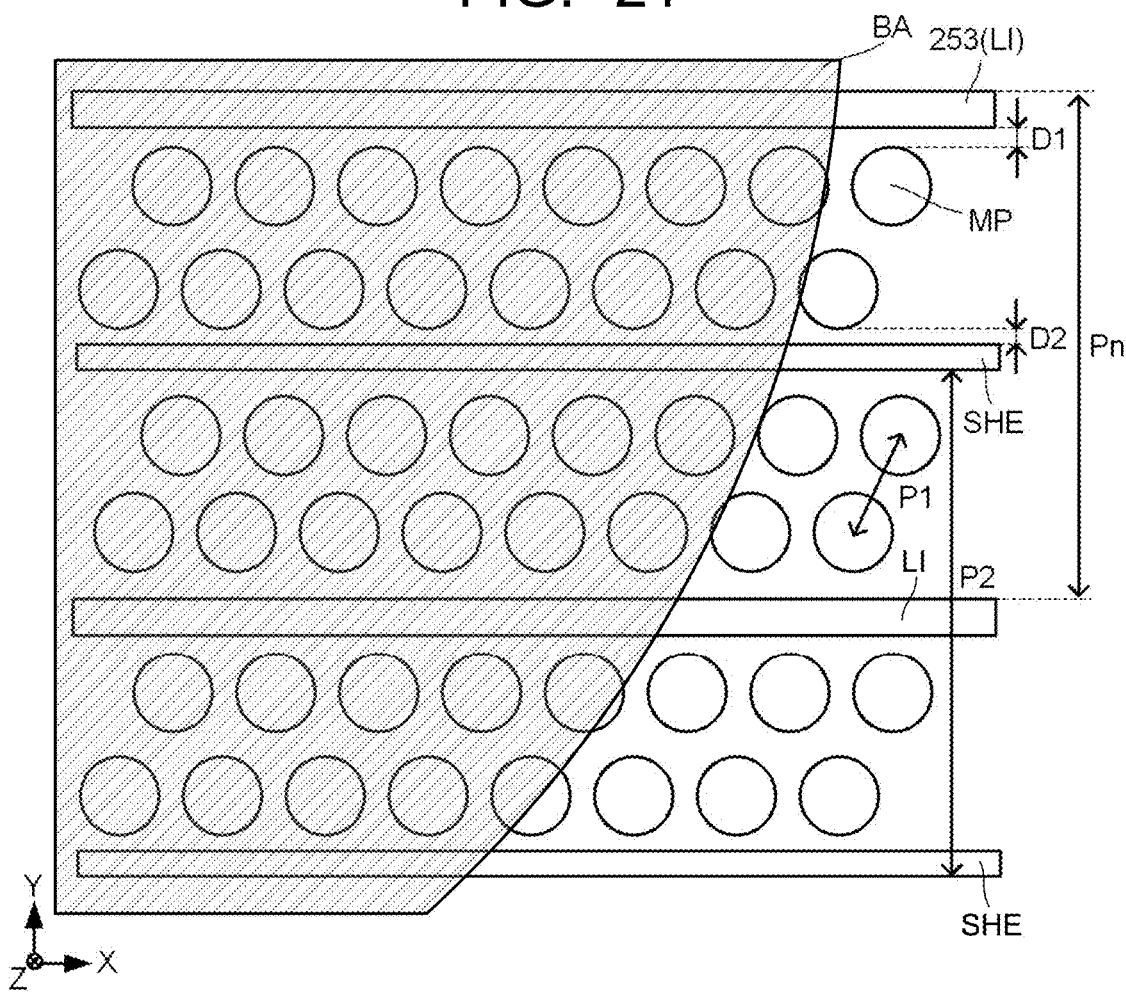
FIG. 21 is a schematic plan view illustrating a light-exposed region.

FIG. 16 is a flow chart for explaining the measuring step S1-1. First, at step S2-1, a measurement target pattern is decided, and pitches P1 and P2 of the measurement target pattern are decided. The measurement target pattern includes, for example, a slit SHE and a memory pillar MP. As illustrated in FIG. 21, for example, the pitch P1 corresponds to a center distance between a plurality of memory pillars MP. As illustrated in FIG. 21, for example, the pitch P2 corresponds to a pattern pitch of mutual slits SHE adjacent in the Y-axis direction (an interval between lower edges of the slits SHE). In order to apply light to the decided measurement target pattern, the measurement device 101 controls the stage 112 to adjust a position of the object 110.

At step S2-2, a layer structure of the object 110 is decided. Optical characteristics such as a material (optical constant) and a film thickness in the vicinity of the surface of the object 110 decide the reflectance of the object 110, furthermore, wavelength dependence of measurement sensitivity. From such a viewpoint, a wavelength λ of light from the light source 111 is decided at step S2-3. The wavelength λ can be decided when, for example, the light wavelength control mechanism controls the light source 111 to control the wavelength of light from the light source 111. The wavelength λ is 800 nm, for example, as illustrated in FIG. 15, but not limited to this.

At step S2-4, a non-measurement target pattern at which diffraction light is formed, which is not the measurement target pattern, is decided, and a pitch Pn of the non-measurement target pattern is decided. The non-measurement target pattern includes a conductive layer LI, for example. As illustrated in FIG. 21, for example, the pitch Pn corresponds to a pattern pitch of the conductive pattern (LI) 253 which are repeatedly arranged in the Y-axis direction (an interval between upper edges of the conductive pattern (LI) 253). A plurality of slits SHE may be provided between the conductive pattern (LI) 253 adjacent in the Y-axis direction.

At step S2-5, a σ value and a numerical aperture NA are decided. The σ value is a ratio of a numerical aperture NA of the illumination optical system 152 to a numerical aperture NA of the objective lens 143. The numerical aperture NA of the objective lens 143 is defined by a maximum angle of light which is incident on the objective lens 143 from the object 110. This angle is an angle with respect to a normal line from the surface of the object 110. A radius of a circular shape indicated by a broken line as an outline of an illumination shape in each of measurement conditions A, B, and C in FIG. 15, corresponds to σNA.

At step S2-6, when an equation 1: $1/Pmax > (1+\sigma)NA/\lambda$ is satisfiable (YES), where Pmax represents a maximum value of pitch of a plurality of types of repetitive patterns, NA represents the numerical aperture of the objective lens 143, σ represents a ratio of the numerical aperture of the illumination optical system 152 to the numerical aperture of the objective lens 143, and λ represents a wavelength of light emitted from each of a plurality of point light sources, first order diffraction light is not incident on the objective lens 143, and thus the first order diffraction light is not a noise. Accordingly, at step S2-7, a first operation is performed in which NA, σ, and λ are set to a single measurement condition to measure a two-dimensional intensity distribution of zero order diffraction light.

When the equation 1: $1/Pmax > (1+\sigma)NA/\lambda$ is not satisfirable (NO) at step S2-6, the first order diffraction light is incident on the objective lens 143, and thus the first order diffraction light is a noise. Accordingly, a second operation is performed in which a plurality of measurement conditions are set to measure a two-dimensional intensity distribution. The second operation has a step of setting a filter by the control device 108, the filter shielding high order diffraction light emitted by a repetitive pattern having a pitch P satisfying an equation 2: $1/P < (1+\sigma)NA/\lambda$ where P represents a pitch of one repetitive pattern out of the plurality of types of repetitive patterns, NA represents the numerical aperture of the objective lens 143, σ represents the ratio of the numerical aperture NA of the illumination optical system 152 to the numerical aperture NA of the objective lens 143, and λ represents the wavelength of light emitted from the plurality of point light sources, and passed through the objective lens 143, a step of detecting only the zero order diffraction light by the imaging device 113 to acquire a two-dimensional intensity distribution, and a step of repeatedly performing the step of setting the filter, and the step of acquiring the two-dimensional intensity distribution, a plurality of times while changing the illumination shape by the optical adjuster 144, and forming a synthesized intensity distribution of the plurality of acquired two-dimensional intensity distributions and calculating a partial pattern positional displacement amount based on the synthesized intensity distribution by the calculation device 103. One example of the second operation will be described below.

At step S2-8, an illumination shape SA of light applied to the surface of the object 110 is decided. The illumination shape SA is preferably a shape regarding which positive first order diffraction light and negative first order diffraction light from the non-measurement target pattern are not incident on the objective lens 143 as much as possible and the zero order diffraction light is mainly incident on the objective lens 143, for example.

At step S2-9, a pixel filter FA is decided. The pixel filter FA preferably has a function of shielding or being completely desensitized with respect to the positive first order diffraction light and the negative first order diffraction light from the non-measurement target pattern, when applying the light having the illumination shape SA to the surface of the object 110.

At step S2-10, a two-dimensional intensity distribution EDA is measured. The two-dimensional distribution EDA is formed by detecting, with respect to a diffraction light distribution generated by applying the illumination light having the illumination shape SA (a gray portion of the illumination shape SA in FIG. 15 is luminous) to a region to be measured of a complex pattern, only zero order diffraction light at the aforementioned portion via the pixel filter FA. It is indicated that the pixel filter FA in FIG. 15 makes light transmit therethrough or has sensitivity with respect to the light only at a gray portion. The two-dimensional intensity distribution EDA is an extracted intensity distribution generated by processing, via the pixel filter FA, a two-dimensional intensity distribution (measured intensity distribution) MDA before being subjected to filtering measured through imaging performed by the imaging device 113, for example. When σ is 1, namely, when NA of the illumination optical system and NA of the objective lens are the same, steps S2-9 and S2-10 do not always have to be performed. Further, in the present embodiment, the case is described in which the illumination shape SA is one in FIG. 15 whose gray portion is luminous, but not limited to this. For example, even if the illumination shape SA has a circular shape (a circular shape indicated by a dotted line having the gray portion in FIG. 15) or a shape having either upper or lower white-colored region, it is possible to eventually obtain, by using the pixel filter FA, a two-dimensional intensity distribution EDA same as that of FIG. 15. As described above, the extracted intensity distribution to be required finally is decided based on a combination of the illumination shape and the filter shape, so that it is possible to decide each of the illumination shape and the filter shape if necessary.

At step S2-11, an illumination shape SB of light applied to the surface of the object 110 is decided. The illumination shape SB is preferably a shape regarding which the positive first order diffraction light from the non-measurement target pattern is not incident on the objective lens 143 and the zero order diffraction light and the negative first order diffraction light are incident on the objective lens 143, for example.

At step S2-12, a pixel filter FB is decided. The pixel filter FB preferably has a function of shielding or being completely desensitized with respect to the negative first order diffraction light from the non-measurement target pattern, when applying the light having the illumination shape SB to the surface of the object 110.

At step S2-13, a two-dimensional intensity distribution EDB is measured. The two-dimensional intensity distribution EDB is formed by detecting, with respect to a diffraction light distribution generated by applying the illumination light having the illumination shape SB (a gray portion of the illumination shape SB in FIG. 15 is luminous) to the region to be measured of the complex pattern, only zero order diffraction light at the aforementioned portion via the pixel filter FB. It is indicated that the pixel filter FB in FIG. 15 makes light transmit therethrough or has sensitivity with respect to the light only at a gray portion corresponding to the zero order diffraction light. The two-dimensional intensity distribution EDB is an extracted intensity distribution generated by processing, via the pixel filter FB, a two-dimensional intensity distribution (measured intensity distribution) MDB before being subjected to filtering measured through imaging performed by the imaging device 113, for example.

At step S2-14, an illumination shape SC of light applied to the surface of the object 110 is decided. The illumination shape SC is preferably a shape regarding which the negative first order diffraction light from the non-measurement target pattern is not incident on the objective lens 143 and the zero order diffraction light and the positive first order diffraction light are incident on the objective lens 143, for example.

At step S2-15, a pixel filter FC is decided. The pixel filter FC preferably has a function of shielding or being completely desensitized with respect to the positive first order diffraction light from the non-measurement target pattern, when applying the light having the illumination shape SC to the surface of the object 110.

At step S2-16, a two-dimensional intensity distribution EDC is measured. The two-dimensional intensity distribution EDC is formed by detecting, with respect to a diffraction light distribution generated by applying the illumination light having the illumination shape SC (a gray portion of the illumination shape SC in FIG. 15 is luminous) to the region to be measured of the complex pattern, only zero order diffraction light at the aforementioned portion via the pixel filter FC. FIG. 15 shows that a gray portion corresponding to the zero order diffraction light in the pixel filter FC transmits light therethrough or has sensitivity with respect to the light. The two-dimensional intensity distribution EDC is an extracted intensity distribution generated by processing a two-dimensional intensity distribution (measured intensity distribution) MDC via the pixel filter FC, the two-dimensional intensity distribution being measured before being subjected to filtering measured through imaging performed by the imaging device 113, for example.

A value at each position of the extracted intensity distribution is defined by a product between a value at each position of the measured intensity distribution and a value of the pixel filter corresponding to each position. When, in the pixel filter, a value at a position to be detected is set to "1" and a value at a position which is not detected is set to "0", a product between a value of a measured intensity distribution at the position which is not detected and a value of the pixel filter corresponding to the position becomes "0", so that it is possible to form an extracted intensity distribution only at the position to be detected. A modulation of the value at the position to be detected of the pixel filter, can obtain not only favorable two-dimensional intensity distributions EDA, EDB, and EDC, but also a favorable synthesized intensity distribution CD. Specifically, at the stage of finally determining the pattern positional displacement amount by using the synthesized intensity distribution CD, it is possible to emphasize a value at a position of greatly contributing to the sensitivity and the SN ratio with respect to the final pattern positional displacement amount measurement, among pixel positions of the synthesized intensity distribution CD, or attenuate, on the contrary, a value at a position which does not make a contribution very much.

The respective operations of the light source 111, the stage 112, and the imaging device 113 are controlled by the control device 108. The respective pieces of measurement data indicating the two-dimensional intensity distributions EDA, EDB, and EDC are stored in the storage device 121. In the present embodiment, the example of obtaining the two-dimensional intensity distributions EDA, EDB, and EDC, in this order, but not limited to this, and any order may be employed when obtaining the pieces of data.

Figure 17:
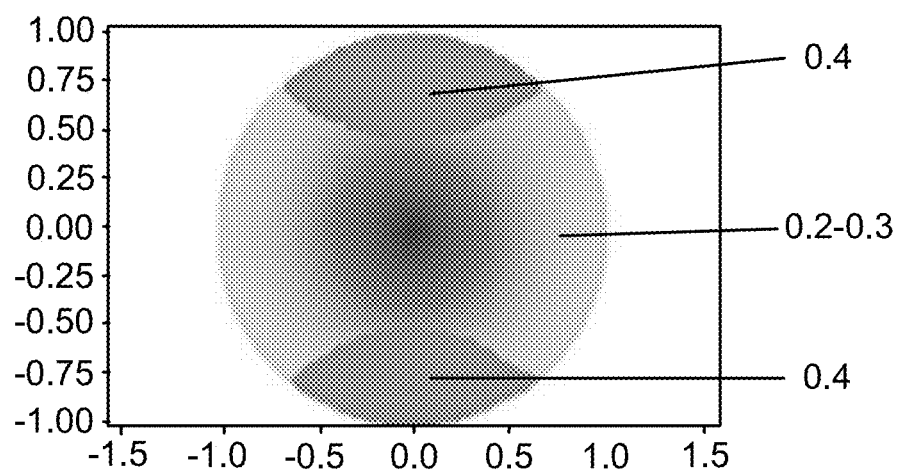
FIG. 17 is a view illustrating an example of a first two-dimensional intensity distribution, and illustrating a case where a position of a conductive pattern 253 with respect to that of MP is exactly as designed.
Figure 18:
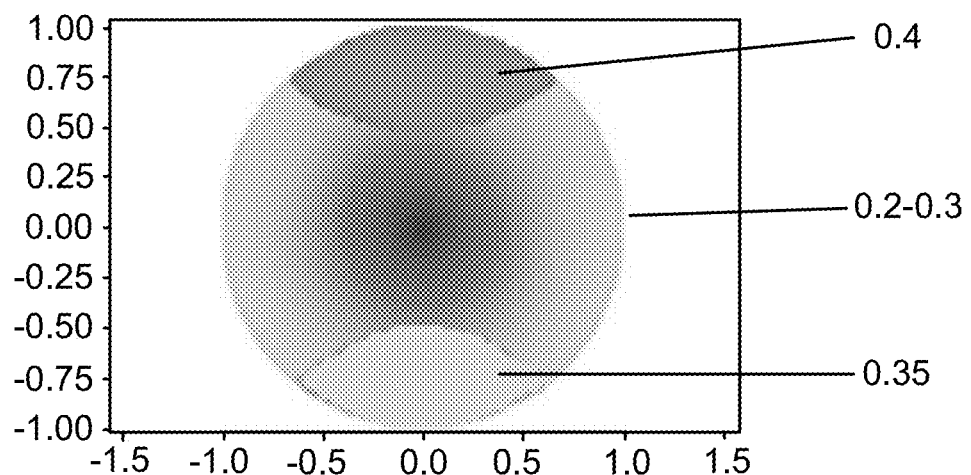
FIG. 18 is a view illustrating an example of the first two-dimensional intensity distribution, and illustrating a case where a position of the conductive pattern 253 with respect to that of MP is displaced from the designed position.

Each of FIG. 17 and FIG. 18 is a view illustrating an example of a first two-dimensional intensity distribution of diffraction light generated when applying light from the light source 111 to the object 110 via the optical system 114 with illumination having a circular shape with an outline size of σNA, without adjusting the illumination shape by the optical adjuster 144, after forming the first complex pattern having the memory pillar MP and the conductive pattern 253. The two-dimensional intensity distribution is obtained from an intensity distribution for each pixel detected by the imaging device 113 having a plurality of pixels arranged two-dimensionally, and indicates intensities at respective XY plane coordinates of zero order diffraction lights which are incident two-dimensionally on the imaging device 113. A horizontal axis of the view of the two-dimensional intensity distribution represents a position of the zero order diffraction light in the X-axis direction. A vertical axis of the view of the two-dimensional intensity distribution represents a position of the zero order diffraction light in the Y-axis direction. A radius of the circular shape in the drawings corresponds to σNA. As described above, the position in the X and Y-axis directions with respect to the optical axis of the aforementioned zero order diffraction light, namely, the displacement amount from the optical axis, corresponds to the illumination angle with respect to the object 110. Specifically, this two-dimensional intensity distribution indicates an intensity of reflected light (zero order diffraction light) for each illumination angle with respect to the object 110. A color gradation of the view of the two-dimensional intensity distribution represents a level of intensity. A numeric value in the drawings indicates an example of a value of an intensity with respect to color. Each numeric value is not necessarily limited to the numeric value indicated in the drawings. Regions with an intensity value of 0.4 positioned at an upper part and a lower part of the intensity distribution illustrated in FIG. 17, are regions in each of which the zero order diffraction light, the negative first order diffraction light, and the positive first order diffraction light from the pattern of the conductive pattern 253 are overlapped. If, in a plan view, the position of the conductive pattern 253 with respect to the position of the memory pillar MP is exactly as designed, the first two-dimensional intensity distribution becomes a vertically symmetric one, as illustrated in FIG. 17. However, when the position of the conductive pattern 253 is displaced from the designed position due to a manufacturing error caused by processing using a photolithography technique, dry etching, or the like used for forming the conductive pattern 253, the first two-dimensional intensity distribution becomes a vertically asymmetric one, as illustrated in FIG. 18. It is indicated that the larger the vertically asymmetric property of the two-dimensional intensity distribution, the larger the positional displacement amount of the conductive pattern 253.

Figure 19:
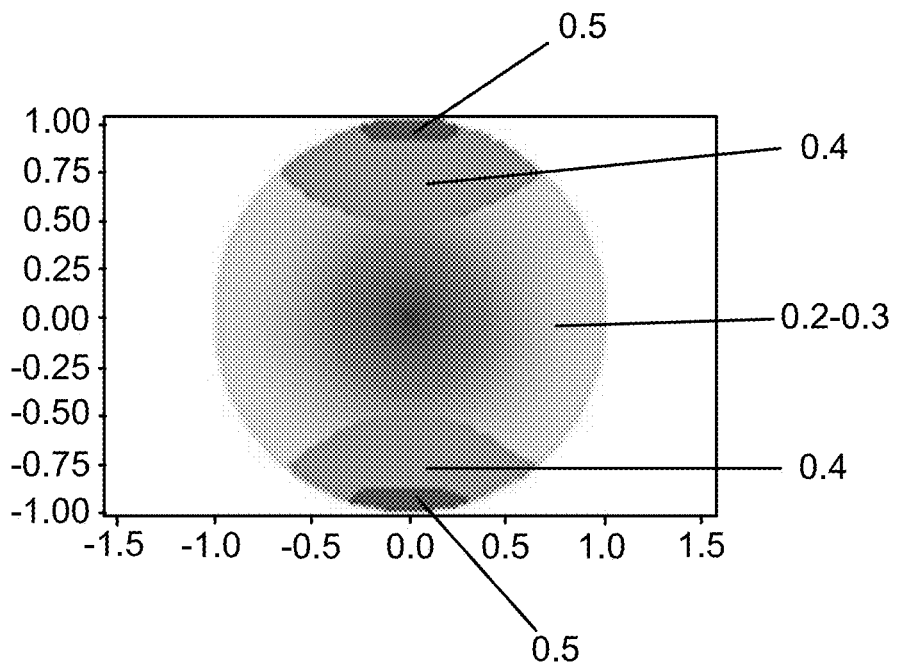
FIG. 19 is a view illustrating an example of a second two-dimensional intensity distribution, and illustrating a case where positions of the conductive pattern 253 and the slit SHE with respect to the position of MP are exactly as designed.
Figure 20:
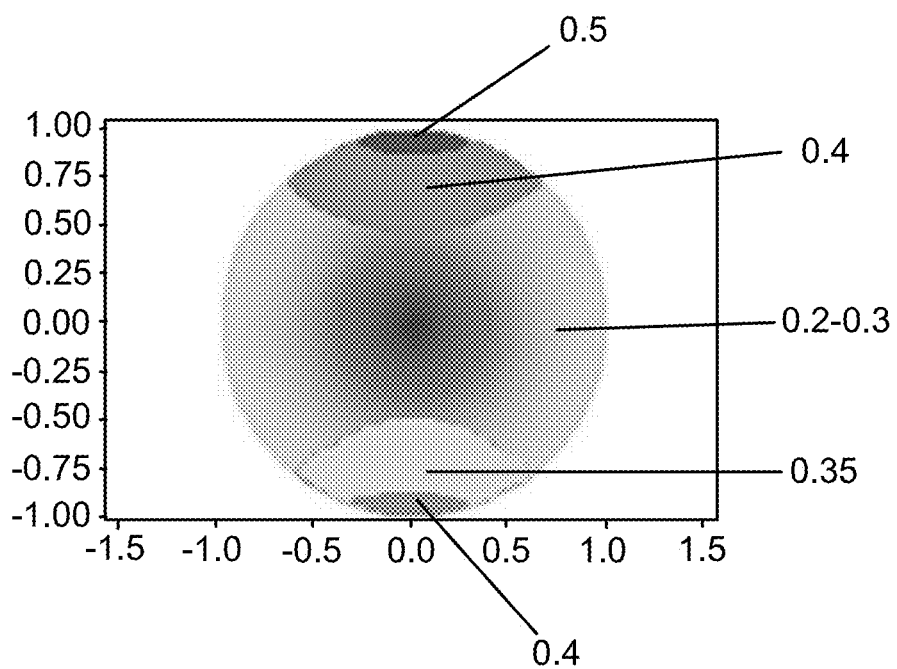
FIG. 20 is a view illustrating an example of the second two-dimensional intensity distribution, and illustrating a case where the positions of the conductive pattern 253 and the slit SHE with respect to the position of MP are displaced from the designed positions.

Each of FIG. 19 and FIG. 20 is a view illustrating an example of a second two-dimensional intensity distribution of zero order diffraction light generated when applying the aforementioned light to the object 110, after forming the second complex pattern having the memory pillar MP, the conductive pattern 253, and the slit SHE. A horizontal axis in each of FIG. 19 and FIG. 20 represents a position of the zero order diffraction light in the X-axis direction. A vertical axis in each of FIG. 19 and FIG. 20 represents a position of the zero order diffraction light in the Y-axis direction. The interpretation regarding these two-dimensional intensity distributions is based upon the interpretation regarding the two-dimensional intensity distributions illustrated in FIG. 17 and FIG. 18. A radius of the circular shape in the drawings corresponds to σNA. Regions with an intensity value of 0.4 positioned at an upper part and a lower part of the intensity distribution illustrated in FIG. 19, are regions in each of which the zero order diffraction light, the negative first order diffraction light, and the positive first order diffraction light from the pattern of the conductive pattern 253 are overlapped. Further, a region with an intensity value of 0.5 is a region having a particularly high value of diffraction intensity of the zero order diffraction light from the SHE. If, in a plan view, the position of the conductive pattern 253 with respect to the position of the memory pillar MP and the position of the slit SHE with respect to the position of the memory pillar MP are exactly as designed, the second two-dimensional intensity distribution becomes a vertically symmetric one, as illustrated in FIG. 19. However, when the position of the conductive pattern 253 and the position of the slit SHE are displaced from the designed positions due to a manufacturing error caused by processing using a photolithography technique, dry etching, or the like used for forming the conductive pattern 253 and the slit SHE, the second two-dimensional intensity distribution becomes a vertically asymmetric one, as illustrated in FIG. 20. It is indicated that the larger the vertically asymmetric property of the two-dimensional intensity distribution, the larger the positional displacement amounts of the conductive pattern 253 and the slit SHE with respect to the position of the memory pillar MP. The vertically symmetric property of the second two-dimensional intensity distribution changes depending on both the positional displacement amount of the conductive pattern 253 and the positional displacement amount of the slit SHE. A light application region is larger than a device pattern region of all of the memory pillar MP, the slit SHE, and the conductive pattern 253, and thus the vertically symmetric property of the second two-dimensional intensity distribution is affected by both the positional displacement of the conductive pattern 253 and the positional displacement of the slit SHE.

FIG. 21 is a schematic plan view illustrating a light application region, and illustrates the memory pillar MP, the conductive pattern (LI) 253, the slit SHE, and a light application region BA. The light-exposed region BA illustrated in FIG. 21 includes the memory pillar MP, the conductive pattern (LI) 253, and the slit SHE. When the positional displacement amount of the conductive pattern (LI) 253 with respect to the MP is increased, an interval D1 between the conductive pattern (LI) 253 and the memory pillar MP (the positional displacement amount in the Y-axis direction of the conductive pattern (LI) 253 with respect to the memory pillar MP) changes. When the positional displacement amount of the slit SHE with respect to the MP is increased, an interval D2 between the slit SHE and the memory pillar MP (the positional displacement amount in the Y-axis direction of the slit SHE with respect to the memory pillar MP) changes. Accordingly, it is difficult to distinguish the positional displacement amount of the conductive pattern (LI) 253 from the positional displacement amount of the slit SHE based only on the second two-dimensional intensity distribution, for example, it is difficult to calculate only the positional displacement amount of the slit SHE.

Figure 22:
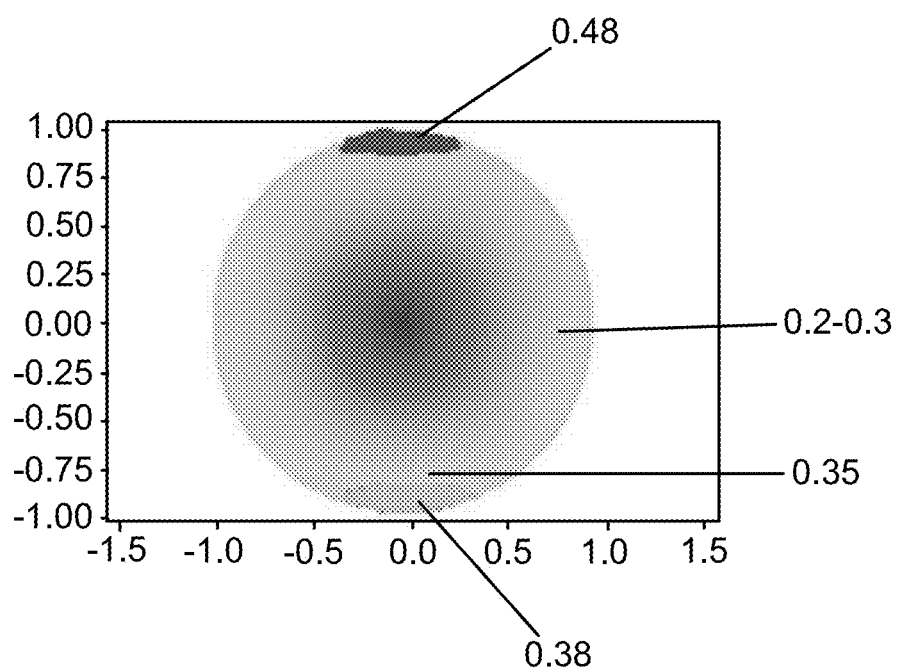
FIG. 22 is a view illustrating an example of a synthesized intensity distribution CD.

Accordingly, the device in the present embodiment divides the illumination shape using the optical adjuster 144 to acquire the two-dimensional intensity distributions in chronological order, reads the plurality of measurement data stored in the storage device 121 and executes the calculating processing using the plurality of measurement data using the calculation device 103 in the calculating step S1-2, to acquire the data indicating the synthesized intensity distribution CD formed by synthesizing the two-dimensional intensity distributions EDA, EDB, and EDC. FIG. 22 is a view of a two-dimensional intensity distribution indicating an example of the synthesized intensity distribution CD. The synthesized intensity distribution CD is a two-dimensional intensity distribution without an influence of noise that is caused when the negative first order diffraction light and the positive first order diffraction light from the conductive pattern 253 (LI) being the non-measurement target pattern are overlapped to be detected. The two-dimensional intensity distribution EDA does not always have to be acquired, and, for example, it is also possible that the operation of acquiring the two-dimensional intensity distribution EDA is not performed, and the data indicating the synthesized intensity distribution CD is formed by synthesizing the two-dimensional intensity distribution EDB and the two-dimensional intensity distribution EDC.

In the data processing step S1-3, the calculation device 103 calculates a positional displacement amount of the slit SHE based on the data indicating the synthesized intensity distribution CD. An example of a calculation method of the positional displacement amount of the slit SHE will be described below.

Figure 23:
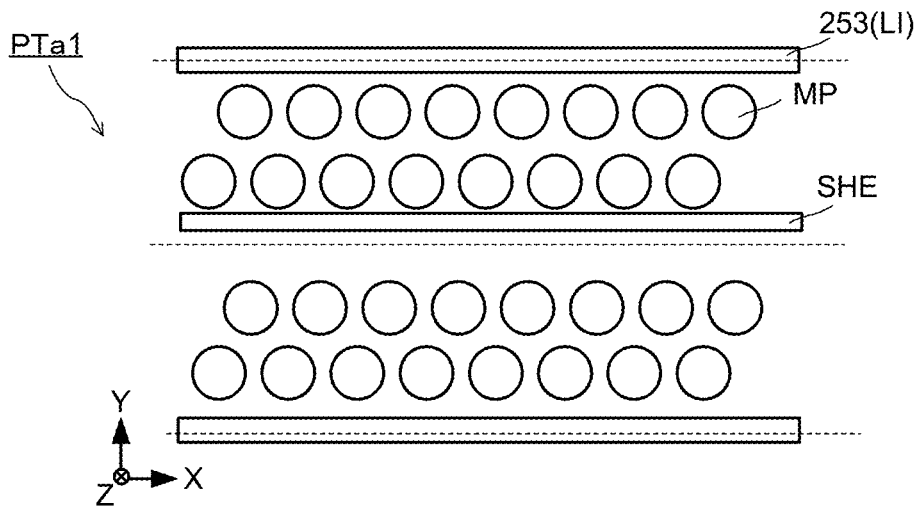
FIG. 23 is a schematic plan view illustrating an example of a calibration pattern PTa1.
Figure 24:
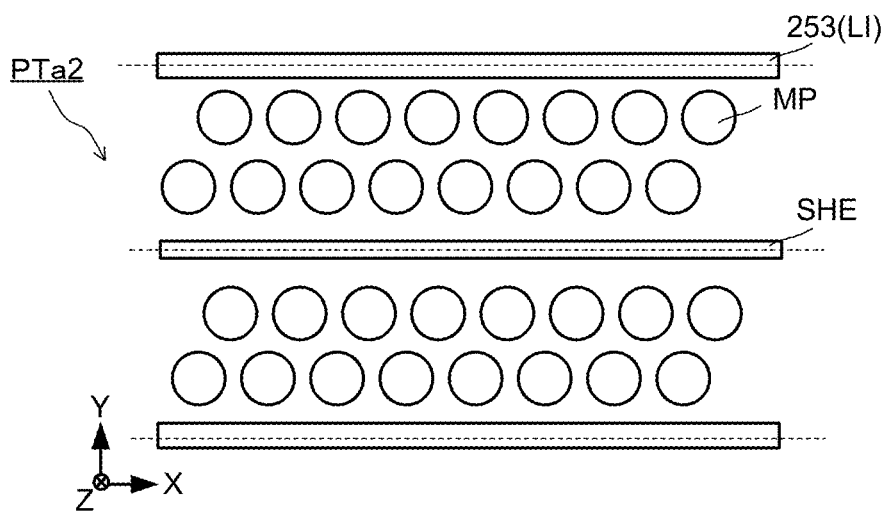
FIG. 24 is a schematic plan view illustrating an example of a calibration pattern PTa2.
Figure 25:
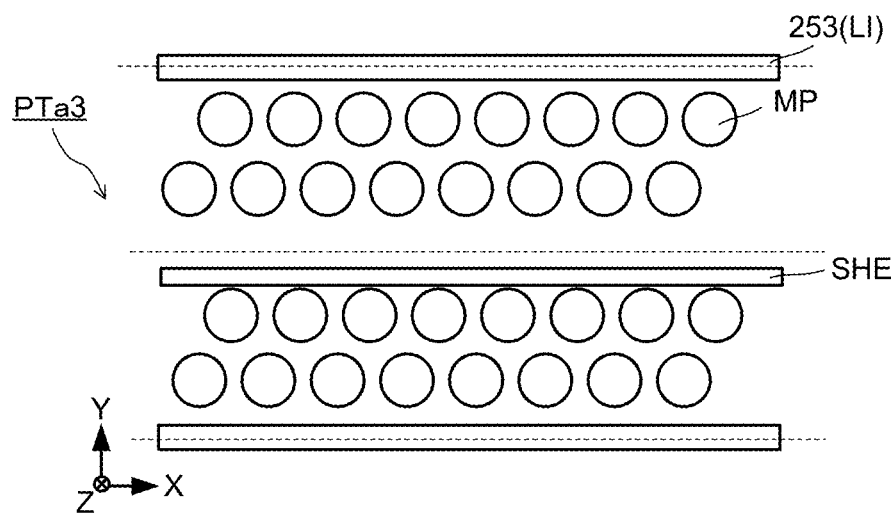
FIG. 25 is a schematic plan view illustrating an example of a calibration pattern PTa3.

First, a calibration pattern in which a displacement amount of the slit SHE with respect to a designed position is clarified beforehand, is prepared. FIG. 23 to FIG. 25 are schematic plan views illustrating examples of calibration patterns. FIG. 23 illustrates a calibration pattern PTa1 in which the positional displacement amount in the Y-axis direction of the formation position of the slit SHE with respect to the designed position (dotted line portion) of the slit SHE is +10 nm. FIG. 24 illustrates a calibration pattern PTa2 in which the positional displacement amount is ±0 nm. FIG. 25 illustrates a calibration pattern PTa3 in which the positional displacement amount is −10 nm. The calibration pattern PTa1, the calibration pattern PTa2, and the calibration pattern PTa3 are located on top of one semiconductor structure, for example.

Figure 26:
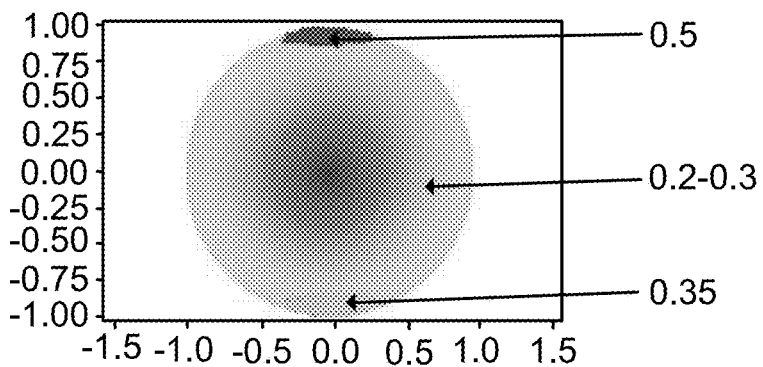
FIG. 26 is a view of illustrating an example of a synthesized intensity distribution CD obtained by the calibration pattern PTa1.
Figure 27:
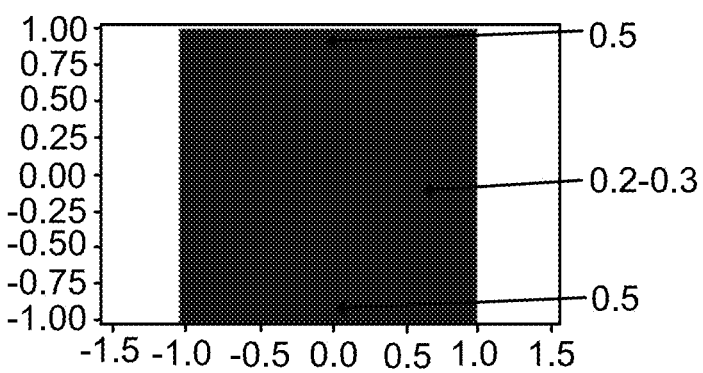
FIG. 27 is a view of illustrating an example of an intensity distribution based on data indicating a synthesized intensity distribution CD obtained by the calibration pattern PTa2.
Figure 28:
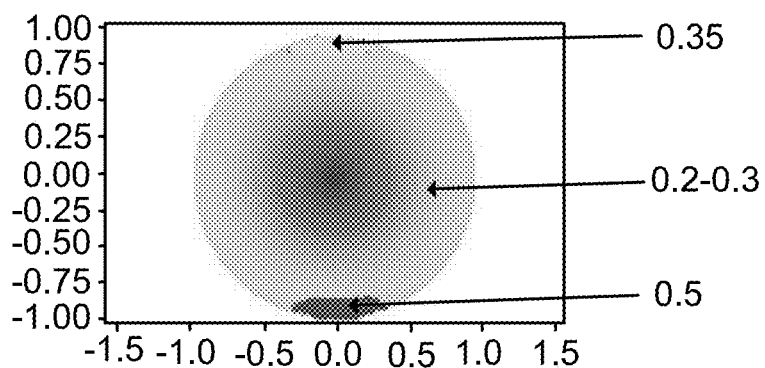
FIG. 28 is a view of illustrating an example of an intensity distribution based on data indicating a synthesized intensity distribution CD obtained by the calibration pattern PTa3.

Regarding each of these calibration patterns PTa1, PTa2, and PTa3, the two-dimensional intensity distributions are measured beforehand, and the calculating processing is performed to acquire the data indicating the synthesized intensity distribution CD, similarly to the object 110. FIG. 26 is a view of a two-dimensional intensity distribution illustrating an example of an intensity distribution based on the data indicating the synthesized intensity distribution CD of the calibration pattern PTa1. FIG. 27 is a view of a two-dimensional intensity distribution illustrating an example of an intensity distribution based on the data indicating the synthesized intensity distribution CD of the calibration pattern PTa2. FIG. 28 is a view of a two-dimensional intensity distribution illustrating an example of an intensity distribution based on the data indicating the synthesized intensity distribution CD of the calibration pattern PTa3. A horizontal axis of each of FIG. 26 to FIG. 28 represents a position of the zero order diffraction light in the X-axis direction. A vertical axis of each of FIG. 26 to FIG. 28 represents a position of the zero order diffraction light in the Y-axis direction. The interpretation regarding these two-dimensional intensity distributions is based upon the interpretation regarding the two-dimensional intensity distributions illustrated in FIG. 17 and FIG. 18.

Figure 29:
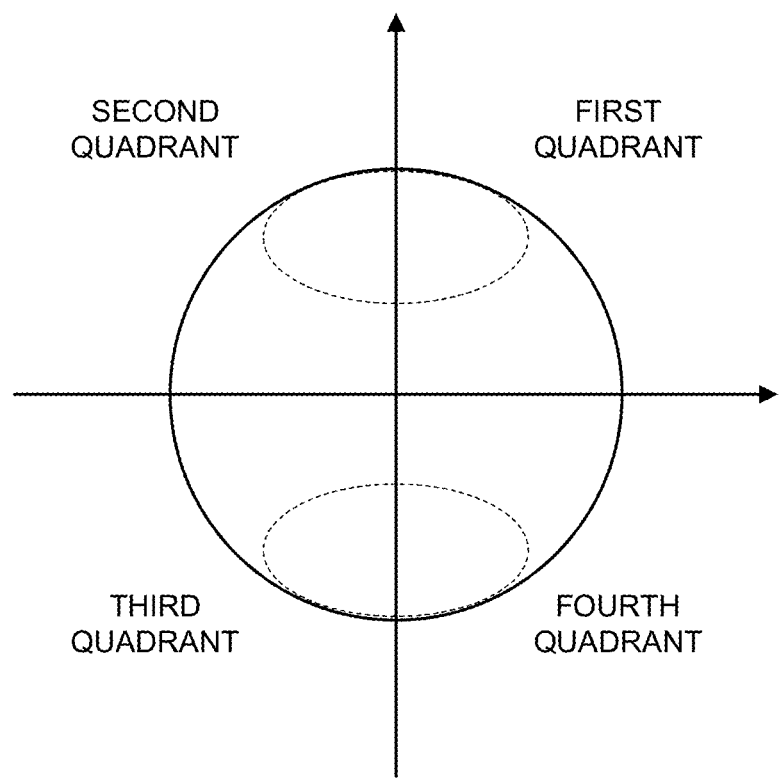
FIG. 29 is a schematic view of a two-dimensional intensity distribution for explaining a calculation method of an asymmetric component.

Next, in each of the synthesized intensity distributions CD, difference data between an upper intensity distribution and a lower intensity distribution is acquired, to calculate an asymmetric component. FIG. 29 is a schematic view of a two-dimensional intensity distribution for explaining the calculation method of the asymmetric component. The asymmetric component has a value obtained by, for example, dividing the two-dimensional intensity distribution into a first quadrant, a second quadrant, a third quadrant, and a fourth quadrant, and subtracting an intensity average value of the third quadrant and the fourth quadrant (an intensity distribution indicated by a dotted line range at a lower side) from an intensity average value of the first quadrant and the second quadrant (an intensity distribution indicated by a dotted line range at an upper side). The calculation method of the asymmetric component is not limited to the above, and any method can be employed as long as it is calculating processing indicating, when data included in the first quadrant and the second quadrant is regarded as a group 1 and data included in the third quadrant and the fourth quadrant is regarded as a group 2, a difference and a ratio between the group 1 and the group 2, for example.

Figure 30:
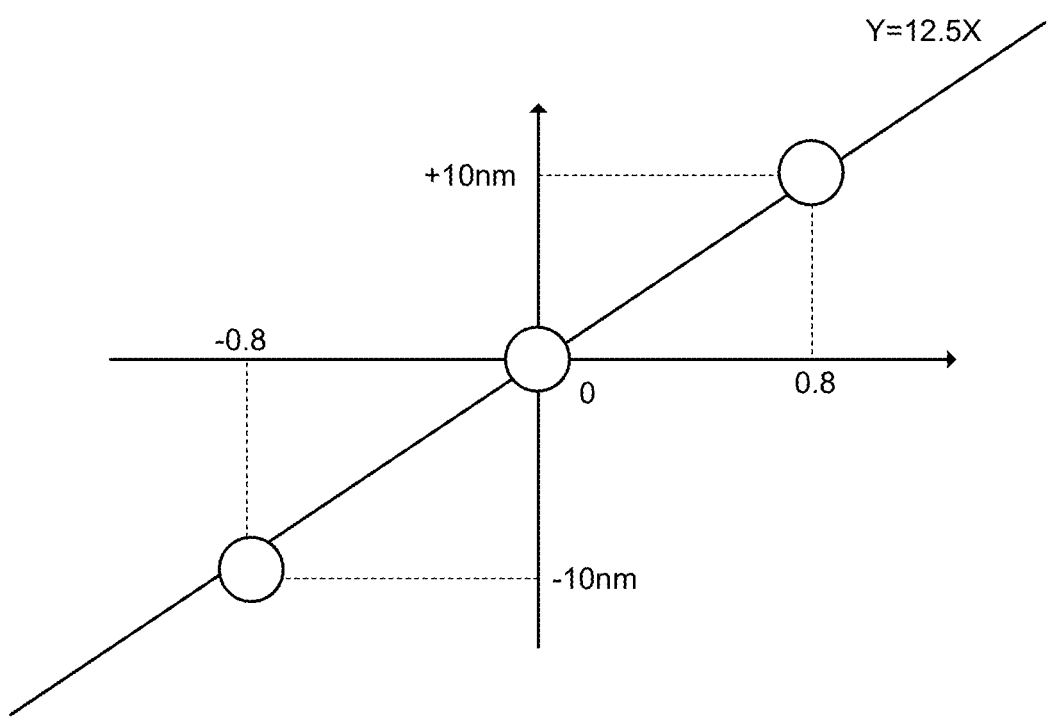
FIG. 30 is a schematic view illustrating an example of a model equation M.
Figure 31:
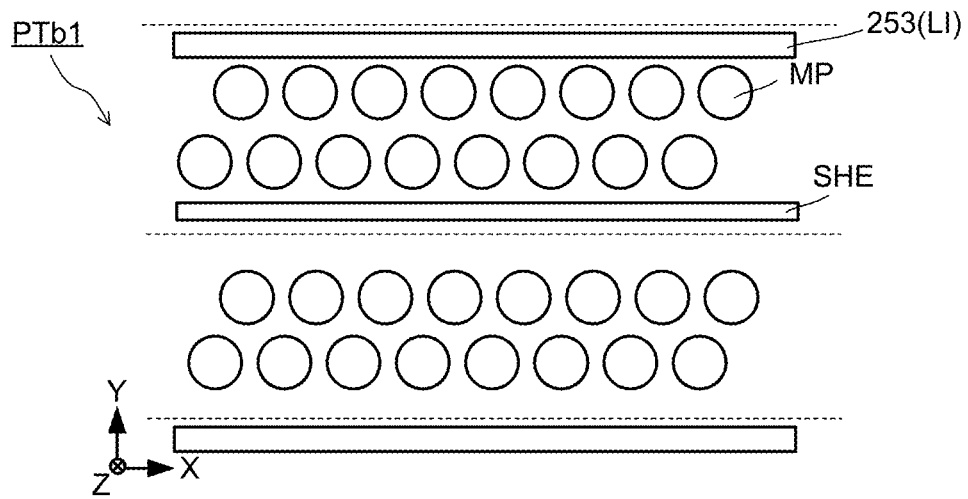
FIG. 31 is a schematic plan view illustrating an example of a calibration pattern PTb1.
Figure 32:
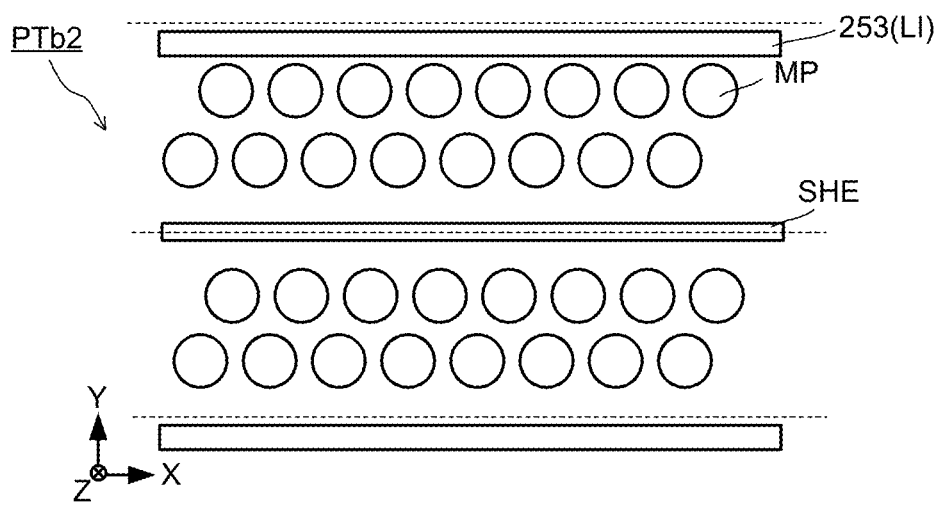
FIG. 32 is a schematic plan view illustrating an example of a calibration pattern PTb2.
Figure 33:
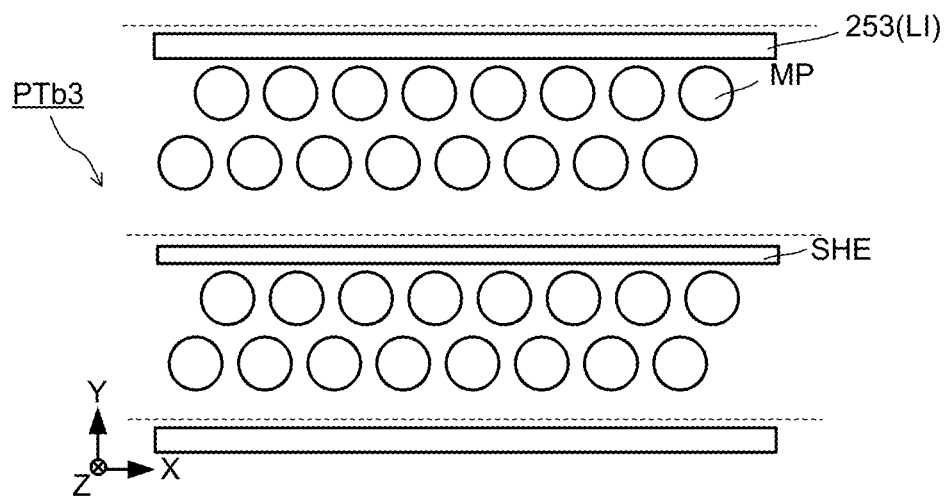
FIG. 33 is a schematic plan view illustrating an example of a calibration pattern PTb3.
Figure 34:
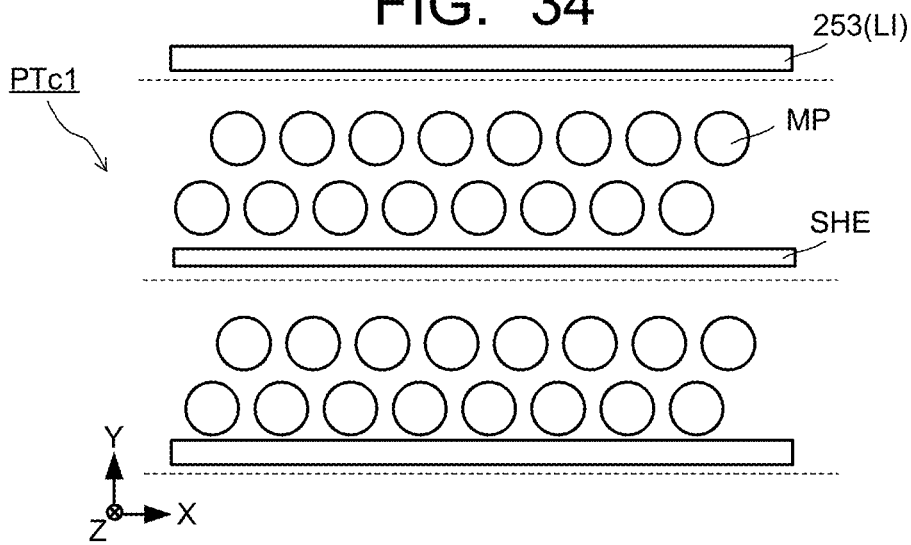
FIG. 34 is a schematic plan view illustrating an example of a calibration pattern PTc1.
Figure 35:
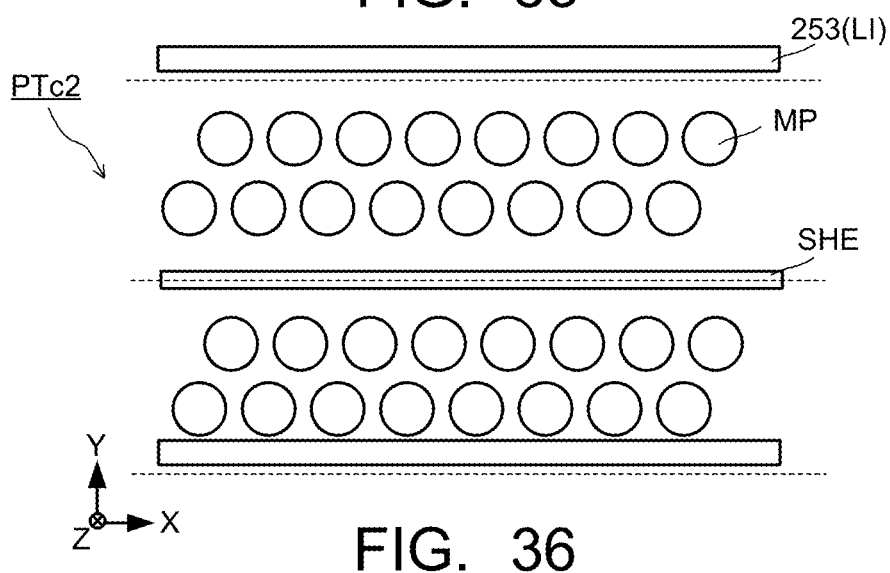
FIG. 35 is a schematic plan view illustrating an example of a calibration pattern PTc2.
Figure 36:
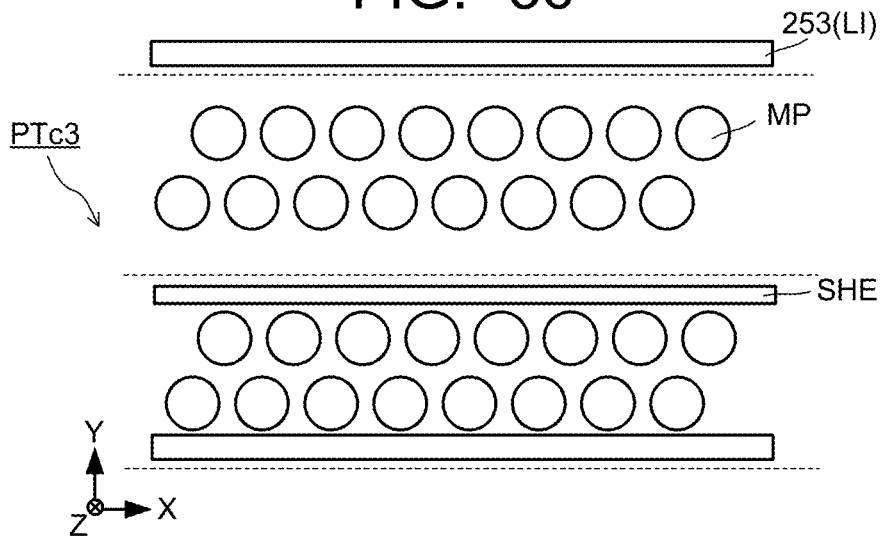
FIG. 36 is a schematic plan view illustrating an example of a calibration pattern PTc3.

Next, linear regression is performed in which the positional displacement amount in the Y-axis direction is set to an objective variable and the asymmetric component is set to an explanatory variable, to create a model equation M: $Y=F(X)$ of the positional displacement amount. FIG. 30 is a schematic view illustrating an example of the model equation M. For example, when the asymmetric component in the calibration pattern PTa1 is −0.8, the asymmetric component in the calibration pattern PTa2 is 0.0, and the asymmetric component in the calibration pattern PTa3 is +0.8, the model equation M is represented by $Y=12.5X$. The model equation M is not limited to the linear regression model, and it is also possible to use a Partial Least Squares (PLS) model or a complicated model such as a neural network.

After that, an asymmetric component of the data indicating the synthesized intensity distribution CD of the object 110 is also acquired through the same method. Next, by substituting the acquired value of the asymmetric component into Y in the model equation M: $Y=12.5X$, it is possible to calculate the positional displacement amount in the Y-axis direction. For example, when the asymmetric component is −0.6, it can be confirmed that the positional displacement amount in the Y-axis direction is −7.5 nm. Data of the calculated positional displacement amount may be then output to the outside of the apparatus 100. In the present embodiment, the influence of the positional displacement of the conductive pattern 253 was small, and thus in the calibration patterns as in the examples illustrated in FIG. 23, FIG. 24, and FIG. 25, the designed position of the conductive pattern 253 is as it is being an original position. When calibration patterns with higher accuracy are wanted to be formed, it is possible to prepare, in addition to the patterns illustrated in FIG. 23, FIG. 24, and FIG. 25 in each of which the displacement amount of the slit SHE with respect to its designed position is clarified beforehand, calibration patterns in which a displacement amount with respect to the designed position of the conductive pattern 253 is clarified beforehand. FIG. 31 to FIG. 36 are schematic plan views each illustrating an example of calibration pattern to be prepared in addition to FIG. 23, FIG. 24, and FIG. 25. For example, as illustrated in patterns PTb1 to PTb3 in FIG. 31 to FIG. 33, and patterns PTc1 to PTc3 in FIG. 34 to FIG. 36, it is possible to prepare patterns of combination between the case where the SHE pattern is displaced by +10 nm, ±0 nm, and −10 nm, respectively, with respect to the designed position, and a case where a positional displacement amount in the Y-axis direction of a formation position of the conductive pattern 253 with respect to a displacement designed position (dotted line portion) with respect to the designed position of the conductive pattern 253 is +10 nm and −10 nm, respectively.

As described above, in the method of measuring the relative positional displacement amount of the partial pattern with respect to another pattern by using the apparatus of the present embodiment, by setting the illumination shape and the pixel filter to measure the two-dimensional intensity distributions of the zero order diffraction light according to the complex pattern formed on the object, and executing the calculating processing using the pieces of measurement data to acquire the data indicating the synthesized intensity distribution, it is possible to extract the two-dimensional intensity distribution of only the zero order diffraction light, resulting in that the calculation accuracy of the positional displacement amount of the desired pattern can be improved.

Second Embodiment

Figure 37:
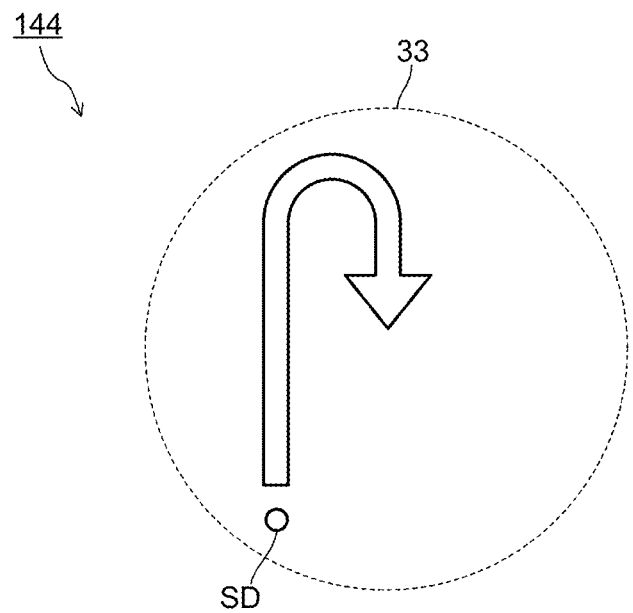
FIG. 37 is a view for explaining an example of a measurement method of a second embodiment.
Figure 38:
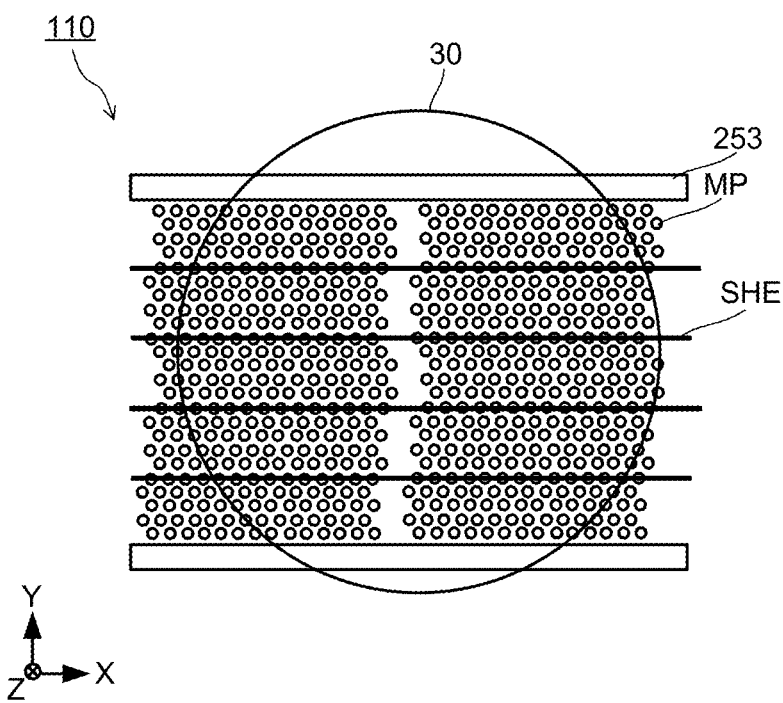
FIG. 38 is a view for explaining an example of the measurement method of the second embodiment.
Figure 39:
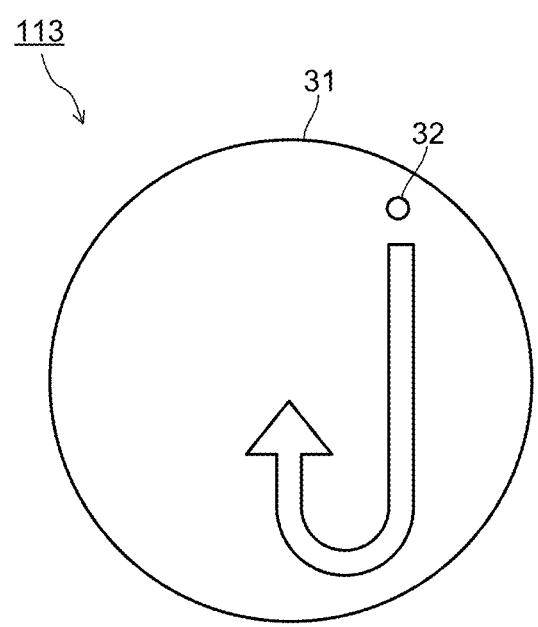
FIG. 39 is a view for explaining an example of the measurement method of the second embodiment.

Although the first embodiment has explained the example of forming the synthesized intensity distribution by using the three measurement conditions, it is not limited to this. FIG. 37, FIG. 38, and FIG. 39 are views for explaining an example of a measurement method of a second embodiment. FIG. 37 illustrates a plane defined by the optical adjuster 144 illustrated in FIG. 3, FIG. 4, and FIG. 5, and SD is a region through which light from the light source 111 is made to transmit (illumination shape). An arrow mark in the drawing indicates a route through which SD moves, and it is possible to repeat an operation of illuminating the object 110 with light while changing a position of SD and detecting the zero order diffraction light. Further, the position of SD can be moved to a predetermined position in a range of an illuminatable region 33. FIG. 38 is a semiconductor pattern formed on the surface of the object 110, and a measurement region is a measurement region to be illuminated by the aforementioned optical system. FIG. 39 illustrates a light receiving surface of the imaging device 113 illustrated in FIG. 3, FIG. 4, and FIG. 5, and pixels 32 indicate an aggregate of pixels having sensitivity. A pixel other than the pixels 32 has no sensitivity. The pixels 32 correspond to a position at which the light transmitted through SD is reflected by the surface of the object, and the zero order diffraction light reaches the imaging device. Further, an arrow mark in the drawing indicates a route of moving the position of the pixels 32 by corresponding to and in conjunction with the position of SD. Regardless of the position of the pixels 32, a region other than that of the pixels 32 has no sensitivity. Specifically, when SD applies light at a predetermined position, only pixels corresponding thereto of the imaging device 113 have sensitivity. A pixel region 31 is a pixel region of the imaging device corresponding to the illuminatable region 33. In the second embodiment, a part different from that of the first embodiment will be explained, and for the other part, the explanation of the first embodiment can be cited appropriately.

In the example of the measurement method of the second embodiment, when the measurement region 30 having the measurement target pattern is illuminated in the measuring step S1-1 illustrated in FIG. 14, the illumination shape SD which is defined by one unit region and whose position is decided to one to perform light application, is very small, so that an illumination angle range of illuminating the measurement region 30 (a region to be measured) of the object 110 is limited to be very small.

The zero order diffraction light from the measurement region 30 of the object 110 illuminated as above, is detected when it is incident on the corresponding pixels 32 in the pixel region 31 of the imaging device 113, as illustrated in FIG. 39. At this time, by setting pixels other than the pixels 32 to have no sensitivity, for example, it is possible to prevent the positive and negative first order diffraction lights which are generated from the non-measurement target pattern and incident on the objective lens 143 from being detected. This can detect only the zero order diffraction light from the measurement region 30. Next, as illustrated in FIG. 37, a position of the illumination light having the illumination shape SD is changed and then the changed illumination light is applied. In accordance with the change in the position, only the pixels 32 at a position corresponding thereto are set to be in a detectable state, and pixels other than the pixels 32 are set to have no sensitivity. This can prevent the positive and negative first order diffraction lights which are generated from the non-measurement target pattern and incident on the objective lens 143 from being detected, even if the illumination light having the illumination shape SD is at any position. Sequential repetition of such operations can acquire zero order diffraction lights corresponding to a plurality of positions of SD. It is possible to measure a plurality of two-dimensional intensity distributions formed by the zero order diffraction light intensities acquired in chronological order as above. A plurality of measurement data indicating the plurality of two-dimensional intensity distributions are stored in the storage device 121. The detection position may be changed at a conjugate position with respect to a pupil plane of the optical system 114.

In the calculating step S1-2 illustrated in FIG. 14, the calculation device 103 reads the plurality of measurement data stored in the storage device 121 and executes the calculating processing using the plurality of measurement data, to acquire the data indicating a synthesized intensity distribution CD formed by synthesizing the plurality of two-dimensional intensity distributions.

In the data processing step S1-3 illustrated in FIG. 14, the calculation device 103 calculates a positional displacement amount of the slit SHE based on the data indicating the synthesized intensity distribution CD. An example of a calculation method of the positional displacement amount of the slit SHE is the same as that of the first embodiment.

As described above, in the method of measuring the relative positional displacement amount of the partial pattern with respect to another pattern by using the apparatus of the present embodiment, by dividing the illumination shape into the plurality of unit regions and performing light application in chronological order for each unit region to measure the two-dimensional intensity distributions of the zero order diffraction light, and executing the calculating processing using the pieces of measurement data to acquire the data indicating the synthesized intensity distribution, it is possible to extract the two-dimensional intensity distribution of only the zero order diffraction light, resulting in that the calculation accuracy of the positional displacement amount of the desired pattern can be improved.

While certain embodiments of the present invention have been described above, these embodiments have been presented by way of example only, and are not intended to limit the scope of the invention. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A measurement apparatus configured to measure a relative positional displacement amount of a partial pattern to another pattern in a complex pattern on a surface of an object, the apparatus comprising:

a measurement part configured to measure a plurality of two-dimensional intensity distributions having a first two-dimensional intensity distribution and a second two-dimensional intensity distribution, the first two-dimensional intensity distribution being formed by applying a first illumination light having a first illumination shape to a region on which the complex pattern is measured and detecting only zero order diffraction light from the region via a first filter, and the second two-dimensional intensity distribution being formed by applying second illumination light having a second illumination shape to the region and detecting only zero order diffraction light from the region via a second filter;

a storage part configured to store a plurality of measurement data indicating the plurality of two-dimensional intensity distributions; and a calculation part configured to execute calculating processing using the plurality of measurement data to form a synthesized intensity distribution obtained by the plurality of two-dimensional intensity distributions, and calculate a positional displacement amount of the partial pattern based on the synthesized intensity distribution.

2. The apparatus according to claim 1, wherein the measurement part comprises:

a light source configured to emit light;

an optical adjuster configured to control an illumination shape of the light to form a plurality of illumination lights having predetermined illumination shapes, the plurality of illumination lights having the first illumination light or the second illumination light; and an imaging device configured to detect only the zero order diffraction light of diffraction lights generated by applying the plurality of illumination lights to the region, and measure the two-dimensional intensity distribution.

3. The apparatus according to claim 1, wherein the measurement part comprises:

a light source plane defined by a plurality of point light sources;

an optically conjugate plane to the light source plane;

an optical adjuster configured to control an external shape and an intensity distribution of an aggregated point light sources in the light source plane and the optically conjugate plane;

an illumination optical system having a function of illuminating a surface of the object, the surface of the object being illuminated by lights from the plurality of point light sources in an illumination shape formed by the optical adjuster, the lights from the plurality of point light sources having a plurality of incident angles corresponding to in-plane positions of the point light sources;

an objective optical system having a function of focusing a plurality of diffraction lights onto corresponding positions on a pupil plane in a point shape, the plurality of diffraction lights being diffracted from the surface of the object illuminated at the plurality of incident angles by the illumination optical system at angles respectively corresponding to the plurality of incident angles;

an imaging device arranged at an optically conjugate position to the pupil plane, the imaging device being configured to measure the two-dimensional intensity distribution;

a polarizer arranged at a predetermined position from the point light sources to the surface of the object via the illumination optical system;

an analyzer arranged at a predetermined position from the surface of the object to the imaging device via the objective optical system;

a filter arranged at an optically conjugate position to the pupil plane, the filter being configured to shield or completely desensitize a region other than a region of zero order diffraction light that reaches the imaging device; and a control device configured to control a set value of a wavelength $\lambda$, of light from each of the point light sources, a set value of a numerical aperture NA of the objective optical system, a set value of a $\sigma$ value defined by a ratio of a numerical aperture NA of the illumination optical system to the numerical aperture NA of the objective optical system, a set value of a light-emitting point distribution in the illumination shape formed by the optical adjuster, and a set value of the filter.

4. The apparatus according to claim 1, wherein the plurality of two-dimensional intensity distributions further have a third two-dimensional intensity distribution, the third two-dimensional intensity distribution being formed by applying a third illumination light having a third illumination shape to the region and detecting only zero order diffraction light from the region via a third filter.

5. The apparatus according to claim 3, wherein the measurement part comprises:

a light source configured to emit the light; and an imaging device configured to receive the zero order diffraction light from the unit region, and measure the plurality of fourth two-dimensional intensity distributions.

6. The apparatus according to claim 1, wherein each of the first filter and the second filter has a function of leading only the zero order diffraction light to the imaging device.

7. The apparatus according to claim 1, wherein the complex pattern has a plurality of repetitive patterns.

8. A measurement apparatus configured to measure a relative positional displacement amount of a partial pattern to another pattern in a complex pattern on a surface of an object, the apparatus comprising:

a measurement part configured to measure a plurality of fourth two-dimensional intensity distributions, the plurality of fourth two-dimensional intensity distributions being formed by sequentially applying a fourth illumination light having a fourth illumination shape to a region on which the complex pattern is measured and detecting only zero order diffraction light from the region;

a storage part configured to store a plurality of measurement data indicating the plurality of fourth two-dimensional intensity distributions; and a calculation part configured to execute calculating processing using the plurality of measurement data to form a synthesized intensity distribution obtained by the plurality of fourth two-dimensional intensity distributions, and calculate a positional displacement amount of the partial pattern based on the synthesized intensity distribution.

9. The apparatus according to claim 1, wherein the object is an intermediate structure formed in the middle of manufacturing a storage device.

10. The apparatus according to claim 1, wherein
the complex pattern includes a first pattern defined by a plurality of memory pillars and a second pattern defined by a plurality of slits, the plurality of memory pillars extends along a direction intersecting the surface of the object, and the plurality of memory pillars being arranged between one of the plurality of slits and another of the plurality of slits from a direction perpendicular to the surface of the object, and
a partial pattern includes the second pattern.

11. The apparatus according to claim 10, wherein
the complex pattern further includes a third pattern defined by a plurality of conductive layers, one of the plurality of slits being arranged between one of the plurality of conductive layers and another of the plurality of conductive layers when viewed from a direction perpendicular to the surface of the object, and
a partial pattern does not include the third pattern.

12. The apparatus according to claim 8, wherein
the complex pattern has a plurality of repetitive patterns.

13. The apparatus according to claim 12, wherein
the object is an intermediate structure formed in the middle of manufacturing a storage device.

14. The apparatus according to claim 12, wherein
the complex pattern includes a first pattern defined by a plurality of memory pillars and a second pattern defined by a plurality of slits, the plurality of memory pillars extends along a direction intersecting the surface of the object, and the plurality of memory pillars being arranged between one of the plurality of slits and another of the plurality of slits from a direction perpendicular to the surface of the object, and
a partial pattern includes the second pattern.

15. The apparatus according to claim 14, wherein
the complex pattern further includes a third pattern defined by a plurality of conductive layers, one of the plurality of slits being arranged between one of the plurality of conductive layers and another of the plurality of conductive layers when viewed from a direction perpendicular to the surface of the object, and
a partial pattern does not include the third pattern.

16. A measurement method using a measurement apparatus,
the apparatus being configured to measure a relative positional displacement amount of a partial pattern to another pattern in a complex pattern on a surface of an object, the complex pattern having a plurality of repetitive patterns, wherein
the apparatus comprises a measurement part and a calculation part, wherein
the measurement part comprises:
a light source plane defined by a plurality of point light sources;
an optically conjugate plane to the light source plane;
an optical adjuster configured to control an external shape and an intensity distribution of the aggregated point light sources in the light source plane and the optically conjugate plane;
an illumination optical system having a function of illuminating the surface of the object, the surface of the object being illuminated by lights from the plurality of point light sources in an illumination shape formed by the optical adjuster, the lights from the plurality of point light sources having a plurality of incident angles corresponding to in-plane positions of the point light sources;
an objective optical system having a function of focusing a plurality of diffraction lights onto corresponding positions on a pupil plane in a point shape, the plurality of diffraction lights being diffracted from the surface of the object illuminated at the plurality of incident angles by the illumination optical system at angles respectively corresponding to the plurality of incident angles;
an imaging device arranged at an optically conjugate position to the pupil plane, the imaging device being configured to measure a two-dimensional intensity distribution; and
a control device configured to control a set value of a wavelength $\lambda$ of light emitted from the point light sources, a set value of a numerical aperture NA of the objective optical system, a set value of a $\sigma$ value being a ratio of a numerical aperture NA of the illumination optical system to the numerical aperture NA of the objective optical system, a set value of a light-emitting point distribution in the illumination shape formed by the optical adjuster, and a set value of a filter,
the measurement method comprising:
a first operation being performed when an equation 1: $1/P_{max} > (1+\sigma)NA/\lambda n$ the equation is satisfiable; and
a second operation being performed when the equation 1 is not satisfiable,
where in the equation 1, Pmax represents a maximum value of pitches of the plurality of repetitive patterns in complex patterns, NA represents the numerical aperture of the objective optical system, $\sigma$ represents a ratio of the numerical aperture of the illumination optical system to the numerical aperture of the objective optical system, and k represents a wavelength of light from each of the plurality of point light sources,
the first operation comprising setting NA, $\sigma$, and $\lambda$ so that the equation 1 is satisfied; and
the second operation comprising:
setting the filter using the control device, the filter being configured to shield high order diffraction lights from a repetitive pattern having a pitch P and through the objective optical system, the pitch P satisfying an equation 2: $1/P < (1+\sigma)NA/\lambda$, where P represents a pitch of one repetitive pattern selected from the group consisting of the plurality of repetitive patterns in complex patterns, NA represents the numerical aperture of the objective optical system, $\sigma$ represents the ratio of the numerical aperture NA of the illumination optical system to the numerical aperture NA of the objective optical system, and $\lambda$ represents the wavelength of light from each of the plurality of point light sources;
detecting only zero order diffraction light using the imaging device to acquire the two-dimensional intensity distribution; and
repeatedly setting the filter and acquiring the two-dimensional intensity distribution a plurality of times while changing the illumination shape using the optical adjuster, and forming a synthesized intensity distribution obtained by the plurality of acquired two-dimensional intensity distributions and calculating a positional displacement amount of the partial pattern based on the synthesized intensity distribution using the calculation part.

17. The method according to claim 16, wherein
the object is an intermediate structure formed in the middle of manufacturing a semiconductor storage device.

18. The method according to claim 16, wherein
the complex pattern includes a first pattern defined by a plurality of memory pillars and a second pattern defined by a plurality of slits, the plurality of memory pillars extends along a direction intersecting the surface of the object, and the plurality of memory pillars being arranged between one of the plurality of slits and another of the plurality of slits along the surface of the object, and
a partial pattern includes the second pattern.

19. The method according to claim 17, wherein
the complex pattern includes a first pattern defined by a plurality of memory pillars and a second pattern defined by a plurality of slits, the plurality of memory pillars extends along a direction intersecting the surface of the object, and the plurality of memory pillars being arranged between one of the plurality of slits and another of the plurality of slits along the surface of the object, and
a partial pattern includes the second pattern.

20. The method according to claim 16, wherein
the complex pattern further includes a third pattern defined by a plurality of conductive layers, one of the plurality of slits being arranged between one of the plurality of conductive layers and another of the plurality of conductive layers along the surface of the object, and
a partial pattern does not include the third pattern.

* * * * *